(12) United States Patent
Takimoto et al.

(10) Patent No.: US 11,652,092 B2
(45) Date of Patent: May 16, 2023

(54) LIGHT-EMITTING DEVICE AND CAPACITOR

(71) Applicant: Murata Manufacturing Co., Ltd., Kyoto (JP)

(72) Inventors: Naomi Takimoto, Kyoto (JP); Takahiro Matsuoka, Kyoto (JP); Takahito Kushima, Kyoto (JP); Tatsuya Ohara, Kyoto (JP); Shota Ando, Kyoto (JP); Hiroyuki Nakano, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 18 days.

(21) Appl. No.: 17/071,347

(22) Filed: Oct. 15, 2020

(65) Prior Publication Data
US 2021/0028158 A1 Jan. 28, 2021

Related U.S. Application Data

(63) Continuation of application No. PCT/JP2019/007021, filed on Feb. 25, 2019.

(30) Foreign Application Priority Data

Apr. 26, 2018 (JP) .............................. JP2018-084615
Jun. 27, 2018 (JP) .............................. JP2018-122000

(51) Int. Cl.
*H05B 45/40* (2020.01)
*H05B 44/00* (2022.01)
(Continued)

(52) U.S. Cl.
CPC ............ *H01L 25/167* (2013.01); *H01S 5/042* (2013.01); *H05B 44/00* (2022.01); *H05B 45/40* (2020.01); *H01G 4/30* (2013.01); *H01G 4/33* (2013.01)

(58) Field of Classification Search
CPC ....... H01S 5/042; H01L 25/167; H05B 45/30; H05B 45/40; H01G 4/30; H01G 4/33
See application file for complete search history.

(56) References Cited

U.S. PATENT DOCUMENTS 5,977,565 A * 11/1999 Ishikawa ................. H01L 33/62
257/E27.12
9,277,647 B2 * 3/2016 Fujimoto ............... H05K 1/111
(Continued)

FOREIGN PATENT DOCUMENTS

| JP | 2009170870 A | 7/2009 |
|---|---|---|
| JP | 2012054263 A | 3/2012 |
| JP | 2016009697 A | 1/2016 |

OTHER PUBLICATIONS

John Glaser, "How GaN Power Transistors Drive High-Performance Lidar: Generating ultrafast pulsed power with GaN FETs", IEEE Power Electronics Magazine, US, Mar. 2017, p. 25-35.
(Continued)

*Primary Examiner* — Jason Crawford
(74) *Attorney, Agent, or Firm* — Pearne & Gordon LLP

(57) ABSTRACT

The present disclosure provides a light-emitting device that is able to output light with a shorter pulse. A light-emitting device according to the present disclosure includes a capacitor, one or more solid-state light-emitting elements that emit light when electric power is supplied from the capacitor, and a semiconductor switch that controls electric power supply from the capacitor to the solid-state light-emitting element. Furthermore, the solid-state light-emitting element is placed on an outer face of the capacitor, the semiconductor switch is placed on the outer face of the capacitor or provided inside the capacitor, and the capacitor includes a connecting electrode between outer electrodes, the connecting electrode
(Continued)

allowing the solid-state light-emitting element and the semiconductor switch to be connected in series.

19 Claims, 22 Drawing Sheets

(51) Int. Cl.
  *H01G 4/30* (2006.01)
  *H01G 4/33* (2006.01)
  *H01L 25/16* (2023.01)
  *H01S 5/042* (2006.01)

(56) References Cited

U.S. PATENT DOCUMENTS

| | | | |
|---|---|---|---|
| 9,697,953 B2* | 7/2017 | Park | H05K 3/3426 |
| 2005/0023575 A1* | 2/2005 | Wu | H01L 27/0288 |
| | | | 257/256 |
| 2009/0161710 A1 | 6/2009 | Hoashi et al. | |
| 2014/0374776 A1* | 12/2014 | Nakasuji | H01L 24/48 |
| | | | 257/82 |
| 2015/0228878 A1* | 8/2015 | Munding | H01L 25/167 |
| | | | 315/113 |
| 2015/0264763 A1* | 9/2015 | Cobo | H05B 45/40 |
| | | | 445/58 |
| 2018/0130603 A1* | 5/2018 | Chong | H01G 4/224 |
| 2018/0132346 A1* | 5/2018 | Yamano | H05K 1/0271 |
| 2018/0259570 A1* | 9/2018 | Henley | H01L 33/36 |
| 2018/0278017 A1* | 9/2018 | Mignoli | G01S 7/484 |
| 2018/0342351 A1* | 11/2018 | Lee | H01G 4/012 |
| 2020/0036156 A1* | 1/2020 | Wojcik | H01S 5/0237 |
| 2021/0028158 A1* | 1/2021 | Takimoto | H01L 25/167 |
| 2021/0044078 A1* | 2/2021 | Adachi | H01S 3/0085 |
| 2021/0265807 A1* | 8/2021 | Iguchi | G06V 20/64 |
| 2022/0231003 A1* | 7/2022 | Mimori | H05K 1/0243 |

OTHER PUBLICATIONS

International Search Report issued in Application No. PCT/JP2019/007021, dated May 28, 2019.

Written Opinion issued in Application No. PCT/JP2019/007021, dated May 28, 2019.

* cited by examiner

LIGHT-EMITTING DEVICE AND CAPACITOR

This is a continuation of International Application No. PCT/JP2019/007021 filed on Feb. 25, 2019, which claims priority from Japanese Patent Application No. 2018-084615 filed on Apr. 26, 2018 and Japanese Patent Application No. 2018-122000 filed on Jun. 27, 2018. The contents of these applications are incorporated herein by reference in their entireties.

BACKGROUND

Technical Field

The present disclosure relates to a light-emitting device that includes one or more solid-state light-emitting elements and a capacitor on which one or more solid-state light-emitting elements may be placed.

Nowadays, LiDAR (Light Detection and Ranging) may be used for automotive systems, meteorological observation systems, and the like. The LiDAR includes a light-emitting device, which is described in Non-Patent Document 1, including a laser diode, a semiconductor switch, a clamp diode, a capacitor for electric power supply, and the like.

Driving methods of light-emitting devices include a capacitive discharge method and a switch control method. In a light-emitting device using the capacitive discharge method, resonance between a parasitic inductance and a capacitor for electric power supply causes a laser diode to generate light with a pulse width. In contrast, in a light-emitting device using the switch control method, controlling ON/OFF of a semiconductor switch controls ON/OFF of a laser diode to cause light with a pulse width to be generated.

Non-Patent Document 1: John Glaser, "How GaN Power Transistors Drive High-Performance Lidar: Generating ultrafast pulsed power with GaN FETs", IEEE Power Electronics Magazine, US, March 2017, p. 25-35

BRIEF SUMMARY

In a light-emitting device using the capacitive discharge method described in Non-Patent Document 1, the laser diode is driven based on a resonant frequency determined from the parasitic inductance and the capacitor for electric power supply. Therefore, the pulse width of output light is fixed, and it is thus difficult to output light with a desired pulse width.

In contrast, in the light-emitting device using the switch control method described in Non-Patent Document 1, light may be output with a desired pulse width to some extent. However, the parasitic inductance restricts the rising speed of current of the laser diode, and there thus arises a problem of requiring a certain time or more to achieve a suitable current value. That is, even with the light-emitting device using the switch control method, only light with a certain pulse width or more can be output, and shortening the pulse of light cannot be achieved.

In automotive systems, a range resolution of several centimeters is generally required to achieve autonomous driving. However, LiDAR is used for the automotive systems, and known light-emitting devices include components, such as a laser diode, a semiconductor switch, a clamp diode, and a capacitor for electric power supply that are arranged on a surface of a printed circuit board or the like. The distance between the arranged components is in the order of several hundred μm, and the parasitic inductance of a current loop including the laser diode at the time when a circuit operates is thus in the order of several nH. As a result, the ON duration during which light is output from the light-emitting device is restricted to a value more than several ns, and there thus arises a problem of not being able to ensure a sufficient range resolution.

The present disclosure provides a light-emitting device that achieves shortening of the pulse of light to be output and a capacitor that achieves shortening of the pulse of light to be output from a solid-state light-emitting element placed in the capacitor.

A light-emitting device according to an embodiment of the present disclosure includes a capacitor that includes a dielectric layer, a first inner electrode and a second inner electrode provided to sandwich the dielectric layer therebetween, a first outer electrode electrically connected to the first inner electrode, and a second outer electrode electrically connected to the second inner electrode; one or more solid-state light-emitting elements that emit light when electric power is supplied from the capacitor; and a switching element that controls electric power supply from the capacitor to the solid-state light-emitting element. The solid-state light-emitting element is placed on an outer face of the capacitor, the switching element is placed on the outer face of the capacitor or provided inside the capacitor, and the capacitor includes a conductive part between the first outer electrode and the second outer electrode, the conductive part allowing the solid-state light-emitting element and the switching element to be connected in series.

A capacitor according to an embodiment of the present disclosure including a dielectric layer, a first inner electrode, and a second inner electrode, the first inner electrode and the second inner electrode being provided to sandwich the dielectric layer therebetween, includes a placement part on which one or more solid-state light-emitting elements that emit light when electric power is supplied from the capacitor and a switching element that controls electric power supply from the capacitor to the solid-state light-emitting element are placed; and a conductive part that is provided on the placement part and allows the capacitor and the switching element to be connected in series.

According to the present disclosure, a solid-state light-emitting element and a switching element are connected in series and are placed on an outer face of a capacitor. Therefore, parasitic inductance can be reduced, and light with a short pulse can thus be output from the solid-state light-emitting element.

DETAILED DESCRIPTION

Figure 1A:
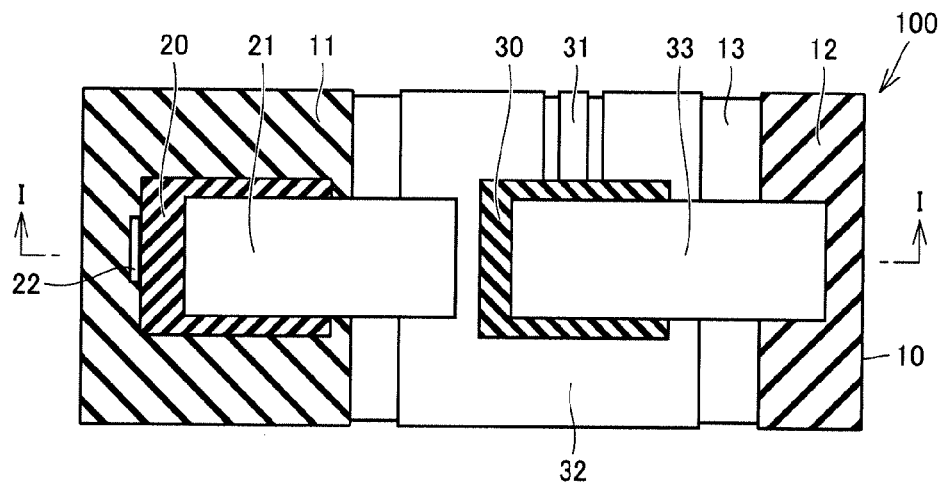
FIGS. 1A and 1B include schematic diagrams for explaining a configuration of a light-emitting device according to a first embodiment of the present disclosure.

Hereinafter, light-emitting devices according to embodiments of the present disclosure will be described in detail with reference to drawings. In the drawings, the same signs represent the same or equivalent parts.

First Embodiment

Figure 1B:
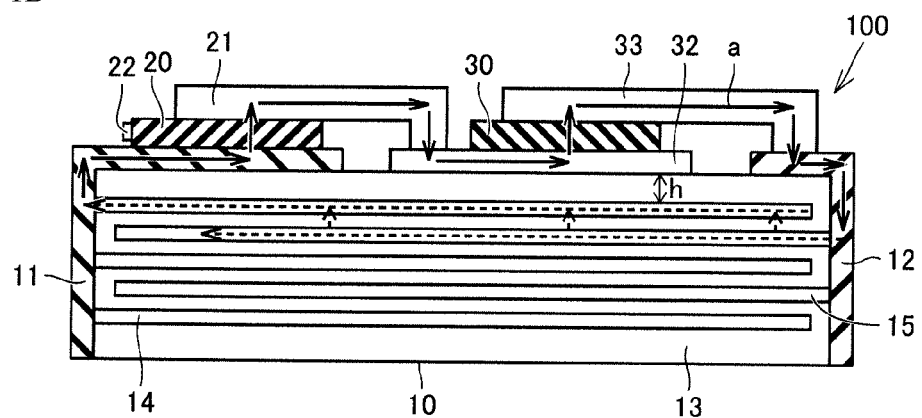

A light-emitting device according to a first embodiment of the present disclosure will be described below with reference to drawings. FIGS. 1A and 1B include schematic diagrams for explaining a configuration of a light-emitting device 100 according to the first embodiment of the present disclosure. FIG. 1A is a plan view of the light-emitting device 100 when viewed from an outer face of a capacitor 10 on which a solid-state light-emitting element 20 is placed, and FIG. 1B is a cross-section view of the light-emitting device 100 taken along plane I-I.

The light-emitting device 100 illustrated in FIGS. 1A and 1B include the capacitor 10, and the solid-state light-emitting element 20 and a semiconductor switch 30 that are placed on the outer face of the capacitor 10. The capacitor 10 is a capacitor for electric power supply and is a multilayer ceramic capacitor. Thus, in the capacitor 10, a plurality of inner electrodes 14 and 15 for acquiring electrostatic capacitance and a dielectric ceramic layer 13 are laminated in an alternate manner. That is, a multilayer body is configured by laminating an inner electrode 14 (first inner electrode) and an inner electrode 15 (second inner electrode) in an alternate manner with the dielectric ceramic layer 13 interposed therebetween. The laminated inner electrodes 14 and 15 are extended to one end portion and the other end portion of the capacitor 10 in an alternate manner. The inner electrodes 14 and 15 that are extended to the corresponding end portions are connected to outer electrodes 11 and 12 that are provided at the corresponding end portions of the capacitor 10. That is, the outer electrode 11 (first outer electrode) is formed at one end portion of the multilayer body, and the outer electrode (second outer electrode) is formed at the other end portion of the multilayer body that is opposite the one end portion.

For example, the capacitor 10 may be formed by laminating a plurality of barium titanate ceramic green sheets (dielectric ceramic layer 13) at which electrode patterns are formed by printing with conductive paste (Ni paste) by screen printing.

Furthermore, the outer electrodes 11 and 12 are also formed on the outer face of the capacitor 10 on which the solid-state light-emitting element 20 and the semiconductor switch 30 are placed. Specifically, in the capacitor 10 illustrated in FIGS. 1A and 1B, the outer electrode 11 is formed on the outer face of the capacitor 10 on the left side on the drawing, and the outer electrode 12 is formed on the outer face of the capacitor 10 on the right side on the drawing. Furthermore, a gate extended electrode 31 and a connecting electrode 32 are formed between the outer electrodes 11 and 12 on the outer face of the capacitor 10.

The solid-state light-emitting element 20 is a light-emitting element in which a solid-state substance emits light when current flows to the substance. The solid-state light-emitting element 20 may be, a light-emitting diode (LED), a laser diode (LD), an electroluminescence element (EL), or the like. The solid-state light-emitting element 20 includes a light-emitting unit 22 that emits light in a direction parallel to the outer face of the capacitor 10. Thus, the light-emitting device 100 is able to output light to a direction parallel to the outer face of the capacitor 10. One electrode (for example, an anode) of the solid-state light-emitting element 20 is connected to the outer electrode 11, and another electrode (for example, a cathode) of the solid-state light-emitting element 20 is electrically connected to wiring 21. The wiring 21 allows the solid-state light-emitting element 20 and the connecting electrode 32 to be electrically connected to each other. A material, such as Au, Al, or Cu may be used as a material for the wiring 21. Furthermore, the wiring 21 may have a shape, such as a wire, a ribbon, or a clip.

The semiconductor switch 30 is a switching element. For example, a silicon MOSFET, GaNFET, or the like is used as the semiconductor switch 30. One electrode (for example, a drain electrode) is connected to the connecting electrode 32, and another electrode (for example, a source electrode) of the semiconductor switch 30 is electrically connected to wiring 33. The gate electrode of the semiconductor switch 30 is electrically connected to the gate extended electrode 31 that is formed on the outer face of the capacitor 10. The wiring 33 allows the semiconductor switch 30 and the outer electrode 12 to be electrically connected to each other. A material, such as Au, Al, or Cu may be used as a material for the wiring 33. Furthermore, the wiring 21 may have a shape, such as a wire, a ribbon, or a clip.

Figure 2:
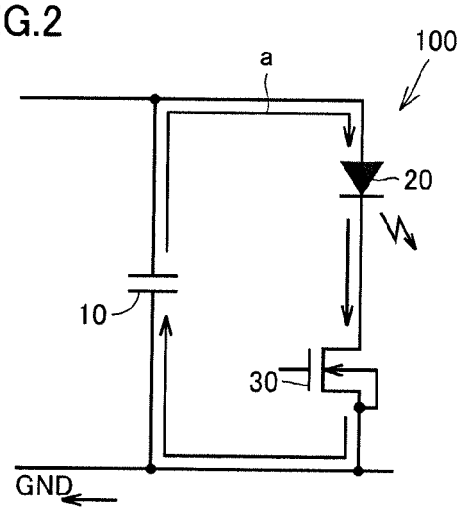
FIG. 2 is a circuit diagram of the light-emitting device according to the first embodiment of the present disclosure.

FIG. 2 is a circuit diagram of the light-emitting device 100 according to the first embodiment of the present disclosure. In the circuit diagram illustrated in FIG. 2, one electrode of the capacitor 10 is connected to one electrode (for example, an anode) of the capacitor 10, and another electrode (for example, a cathode) of the solid-state light-emitting element 20 is connected to the semiconductor switch 30. One electrode (for example, a drain electrode) of the semiconductor switch 30 is connected to the solid-state light-emitting element 20, and another electrode (for example, a source electrode) of the semiconductor switch 30 is connected to another electrode of the capacitor 10 and GND wiring.

In the light-emitting device 100, the solid-state light-emitting element 20 and the semiconductor switch 30 are placed on the outer face of the capacitor 10, and the capacitor 10, the solid-state light-emitting element 20, and the semiconductor switch 30 are connected in series using the outer electrodes 11 and 12, the wiring 21, the connecting electrode 32, and the wiring 33, as illustrated in FIG. 2. The wiring 21 and the connecting electrode 32 form a conductive part that allows the solid-state light-emitting element 20 and the semiconductor switch 30 to be connected in series. The conductive part illustrated in FIGS. 1A and 1B are merely an example. The configuration of wiring, electrodes, and the like provided may be changed according to the circuit configuration or manufacturing.

Furthermore, the capacitor 10 has its outer face as a placement part on which the solid-state light-emitting element 20 is placed. On the outer face of the capacitor 10, the connecting electrode 32 is provided as a conductive part that allows the capacitor 10 and the semiconductor switch 30 to be connected in series.

In the light-emitting device 100, the solid-state light-emitting element 20 and the semiconductor switch 30 are mounted on the outer face of the capacitor 10. Therefore, the distance between the capacitor 10 and the solid-state light-emitting element 20 and the distance between the capacitor 10 and the semiconductor switch 30 can be shortened compared to a case where known wiring connection is performed. That is, in the light-emitting device 100, as illustrated in FIGS. 1B and 2, a current loop a that goes through the capacitor 10, the solid-state light-emitting element 20, and the semiconductor switch 30 can be shortened.

Furthermore, regarding the direction of current flowing in the current loop a, as illustrated in FIG. 1B, the direction (solid-line arrows) in which current flows in the outer electrodes 11 and 12 and the connecting electrode 32 and the direction (broken-line arrows) in which current flows in the inner electrodes 14 and 15 are opposite to each other. Furthermore, the direction (solid-line arrows) in which current flows in the outer electrodes 11 and 12 and the connecting electrode 32 and the direction (broken-line arrows) in which current flows in the inner electrodes 14 and 15 are opposite to each other with a distance h of the exterior thickness of the capacitor 10. That is, the current loop a can be shortened to the extent that the distance between opposing currents flowing in opposite directions becomes the distance h. In contrast, if the capacitor 10, the solid-state light-emitting element 20, and the semiconductor switch 30 are connected by wiring as in known techniques, the distance between opposing currents flowing in opposite directions is longer than the distance h.

In the light-emitting device 100, due to a reduced distance between opposing currents flowing in opposite directions, the effect that magnetic fluxes cancel each other out (effect of offset) increases, and the parasitic inductance of the current loop a can thus be reduced. Therefore, in the case where the light-emitting device 100 uses the capacitive discharge method, the parasitic inductance of the current loop a is small, and the power supply voltage can thus be lowered. As a result, reductions in the cost and size of the light-emitting device 100 can be achieved. Furthermore, in the case where the light-emitting device 100 uses the switch control method, the parasitic inductance of the current loop a is small. Thus, the pulse width of current can be reduced, and light with a short pulse can be output from the solid-state light-emitting element.

As described above, the light-emitting device 100 according to the first embodiment includes the dielectric ceramic layer 13, the inner electrodes 14 (first inner electrodes) and the inner electrodes 15 (second inner electrodes) that are provided with the dielectric ceramic layer 13 interposed therebetween, the outer electrode 11 (first outer electrode) that is electrically connected to the inner electrodes 14, and the outer electrode 12 (second outer electrode) that is electrically connected to the inner electrodes 15. The light-emitting device 100 further includes one or more solid-state light-emitting elements 20 that emit light when electric power is supplied from the capacitor 10 and the semiconductor switch 30 (switching element) that controls power supply from the capacitor 10 to the solid-state light-emitting element 20. Furthermore, the solid-state light-emitting element 20 is placed on the outer face of the capacitor 10, the semiconductor switch 30 is placed on the outer face of the capacitor 10 or inside the capacitor 10, and the capacitor 10 includes a conductive part between the outer electrode 11 and the outer electrode 12 so that the solid-state light-emitting element 20 and the semiconductor switch 30 can be connected in series with each other. Therefore, in the light-emitting device 100, by reducing the distance between opposing currents flowing in opposite directions to the distance h, the parasitic inductance of the current loop a can be reduced, and light with a short pulse can be output from the solid-state light-emitting element 20. The light-emitting device 100 according to the first embodiment has a configuration in which the connecting electrode 32 is provided as a conductive part on the outer face of the capacitor 10.

The capacitor 10 includes the outer face (placement part) on which the one or more solid-state light-emitting elements 20 that emit light when electric power is supplied from the capacitor 10 and the semiconductor switch 30 (switching element) that controls power supply from the capacitor 10 to the solid-state light-emitting element 20 are placed and the connecting electrode 32 (conductive part) that is provided on the outer face of the capacitor 10 and allows the capacitor 10 and the semiconductor switch 30 to be connected in series. Thus, the distance between opposing currents flowing in opposite directions can be reduced to the distance h by placing the solid-state light-emitting element 20 and the semiconductor switch 30 on the outer face of the capacitor 10, and the parasitic inductance of the current loop a can be reduced. Consequently, light with a short pulse can be output from the solid-state light-emitting element 20.

Second Embodiment

Figure 3A:
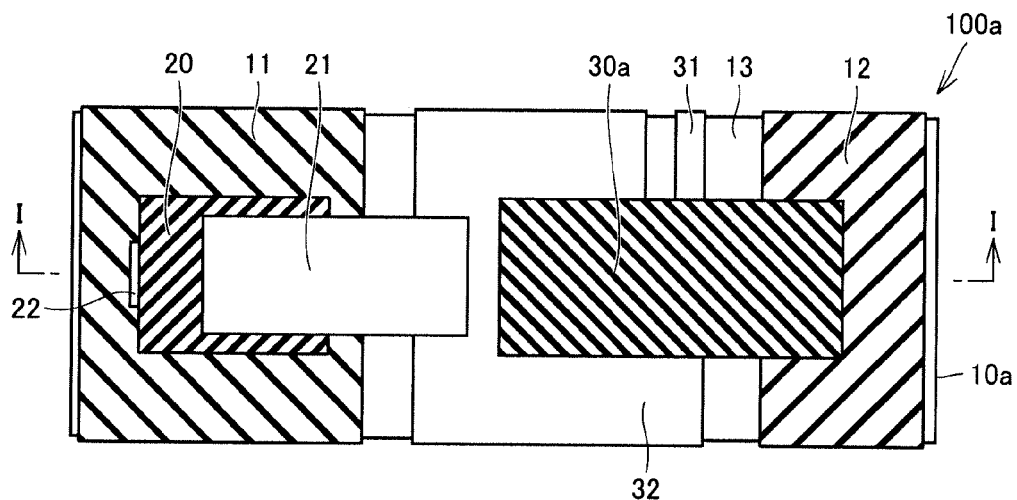
FIGS. 3A, 3B, and 3C include schematic diagrams for explaining a configuration of a light-emitting device according to a second embodiment of the present disclosure.
Figure 3B:
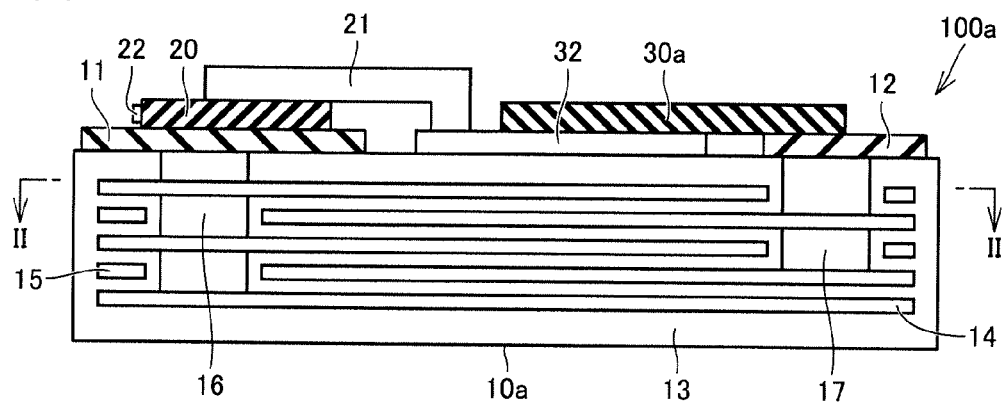
Figure 3C:
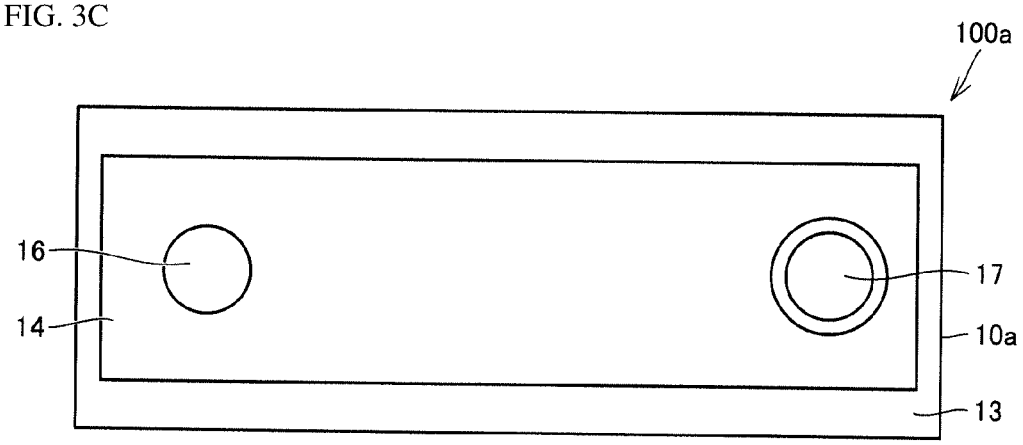

In the light-emitting device 100 according to the first embodiment, as illustrated in FIG. 1B, the outer electrodes 11 and 12 are formed in the corresponding end portions of the multilayer body, and the size of the current loop a is under the constraint of the external size of the capacitor 10. Thus, in a second embodiment of the present disclosure, a configuration is used in which an outer electrode and an inner electrode are electrically connected using a via conductor for a capacitor. FIGS. 3A, 3B, and 3C include schematic diagrams for explaining a configuration of a light-emitting device 100a according to the second embodiment of the present disclosure. FIG. 3A is a plan view of the light-emitting device 100a when viewed from the outer face of a capacitor 10a on which the solid-state light-emitting element 20 is placed, FIG. 3B is a cross-section view of the light-emitting device 100a taken along plane I-I, and FIG. 3C is a cross-section view of the light-emitting device 100a taken along plane II-II. The same features of the configuration of the light-emitting device 100a illustrated in FIGS. 3A, 3B, and 3C as those of the configuration of the light-emitting device 100 illustrated in FIGS. 1A and 1B will be referred to with the same signs as those of the configuration of the light-emitting device 100, and detailed explanation for those same features will not be repeated.

The light-emitting device 100a illustrated in FIGS. 3A, 3B, and 3C include the capacitor 10a, and the solid-state light-emitting element 20 and a semiconductor switch 30a that are placed on the outer face of the capacitor 10a. The capacitor 10a is a capacitor for electric power supply and is a multilayer ceramic capacitor. Thus, the capacitor 10a is configured to be a multilayer body in which the plurality of inner electrodes 14 and 15 for acquiring electrostatic capacitance and the dielectric ceramic layer 13 are laminated in an alternate manner.

As illustrated in FIG. 3B, in the capacitor 10a, via conductors 16 and 17 that penetrate through the multilayer body are formed. The via conductor 16 allows the outer electrode 11 formed on the outer face of the capacitor 10a and the laminated inner electrodes 14 to be electrically connected to each other. As illustrated in FIG. 3C, the inner electrodes 14 are electrically connected to the via conductor 16. However, the inner electrodes 14 are not electrically connected to the via conductor 17. The via conductor 17 allows the outer electrode 12 formed on the outer face of the capacitor 10a and the laminated inner electrodes 15 to be electrically connected to each other. Although not illustrated in the drawings, the inner electrodes 15 are electrically connected to the via conductor 17, whereas the inner electrodes 15 are not electrically connected to the via conductor 16.

One electrode (for example, a drain electrode) of the semiconductor switch 30a and another electrode (for example, a source electrode) of the semiconductor switch 30a are formed on the same face. Therefore, the one electrode (for example, the drain electrode) of the semiconductor switch 30a is connected to a connecting electrode 32, and the other electrode (for example, the source electrode) of the semiconductor switch 30a is electrically connected to the outer electrode 12.

By connecting the outer electrode 11 and the inner electrodes 14 by the via conductor 16 that penetrates through the multilayer body and connecting the outer electrode 12 and the inner electrodes 15 by the via conductor 17 that penetrates through the multilayer body, the distance between the via conductor 16 and the via conductor 17 is shorter than the distance between the outer electrode 11 and the outer electrode 12 that are formed on end faces of the capacitor 10, as illustrated in FIG. 1B. Thus, a current loop of the light-emitting device 100a is shorter than the current loop a of the light-emitting device 100, and the parasitic inductance of the light-emitting device 100a can further be reduced.

Although the via conductors 16 and 17 are formed inside the capacitor 10a, the via conductors 16 and 17 are desirably formed below positions at which the solid-state light-emitting element 20 and the semiconductor switch 30a are placed. Specifically, the via conductor 16 is provided near one electrode (for example, an anode) of the solid-state light-emitting element 20, and the via conductor 17 is provided near another electrode (for example, a source electrode) of the semiconductor switch 30a. Accordingly, each of the connection distance from the solid-state light-emitting element 20 to the capacitor 10a and the connection distance from the semiconductor switch 30a to the capacitor 10a can be reduced, and the current loop of the light-emitting device 100a can further be shortened.

As described above, in the light-emitting device 100a according to the second embodiment, the capacitor 10a includes the via conductor 16 (first via conductor) that is electrically connected to the inner electrodes 14 and the solid-state light-emitting element 20 and the via conductor (second via conductor) that is electrically connected to the inner electrodes 15 and the semiconductor switch 30a. Furthermore, the via conductors 16 and 17 are electrically connected to the outer electrodes 11 and 12 of the capacitor 10a.

Thus, in the light-emitting device 100a, with the via conductors 16 and 17 formed, the solid-state light-emitting element 20 and the semiconductor switch 30a can be connected to the inner electrodes 14 and 15 inside the capacitor 10a at positions more inward than the external size of the capacitor 10a, and the current loop can further be shortened. Thus, the parasitic inductance can further be reduced. The configuration in which via conductors are formed in a multilayer ceramic capacitor as the capacitor 10a has been described above. However, a configuration may also be used in which via conductors are formed in other types of capacitor (for example, a semiconductor capacitor) described below.

Furthermore, the via conductor 16 (first via conductor) may be provided at a position connected to one end (for example, an anode) of the solid-state light-emitting element 20 placed on the outer face of the capacitor 10a, and the via conductor 17 (second via conductor) may be provided at a position connected to one end (for example, a source electrode) of the semiconductor switch 30a placed on the outer face of the capacitor 10a. Accordingly, in the light-emitting device 100a, by reducing the connection distance between the capacitor 10a and each of the solid-state light-emitting element 20 and the semiconductor switch 30a, the current loop can further be shortened, and the parasitic inductance can further be reduced.

Third Embodiment

The configuration of the light-emitting device 100 according to the first embodiment that includes the capacitor 10, and the solid-state light-emitting element 20 and the semiconductor switch 30 that are placed on the outer face of the capacitor 10 has been described above. However, elements placed on the outer face of the capacitor are not limited to the solid-state light-emitting element and the semiconductor switch. In a third embodiment of the present disclosure, a configuration in which elements other than the solid-state light-emitting element and the semiconductor switch are placed on the outer face of the capacitor will be described.

Figure 4A:
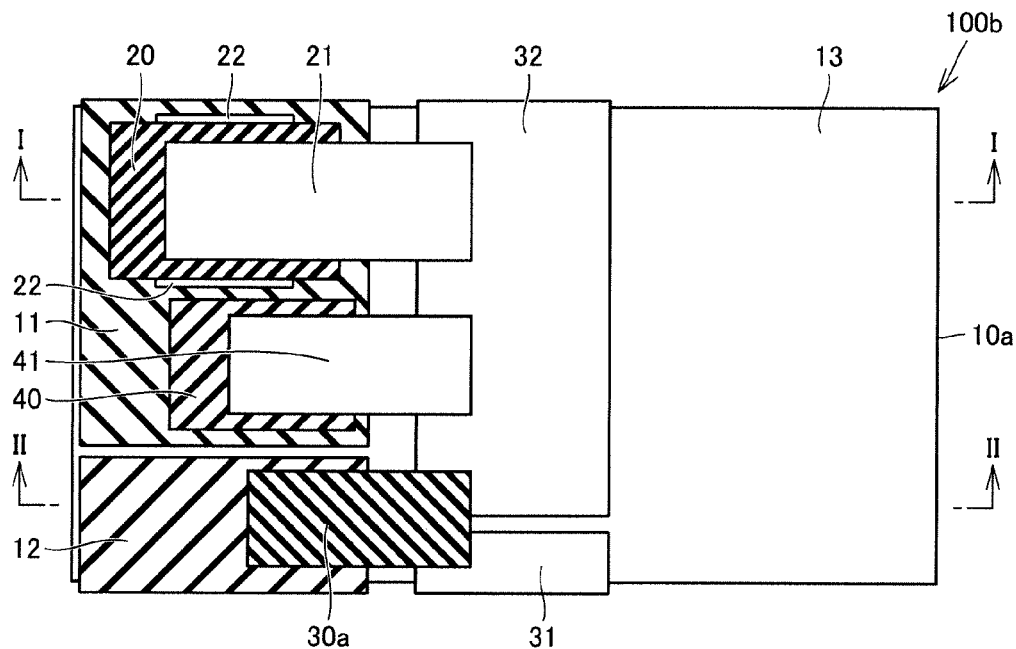
FIGS. 4A, 4B, and 4C include schematic diagrams for explaining a configuration of a light-emitting device according to a third embodiment of the present disclosure.
Figure 4B:
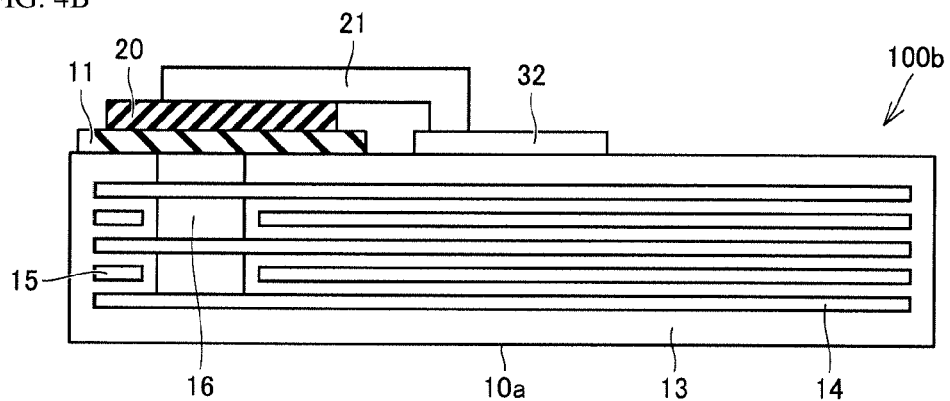
Figure 4C:
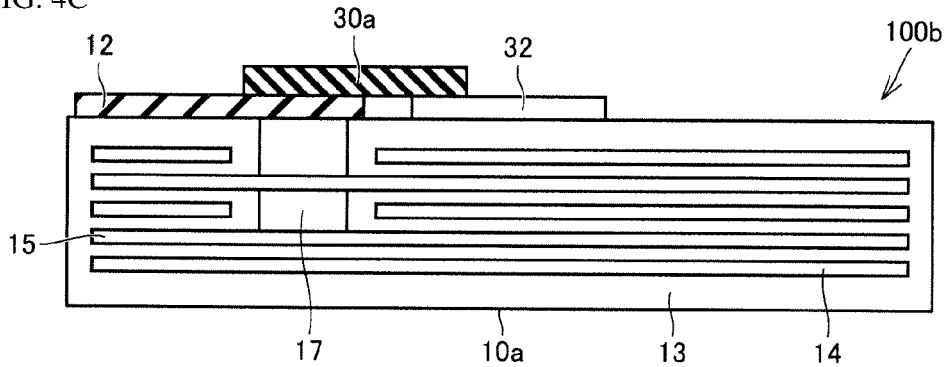

FIGS. 4A, 4B, and 4C include schematic diagrams for explaining a configuration of a light-emitting device 100b according to a third embodiment of the present disclosure. FIG. 4A is a plan view of the light-emitting device 100b when viewed from the outer face of the capacitor 10a on which the solid-state light-emitting element 20 is placed, FIG. 4B is a cross-section view of the light-emitting device 100b taken along plane I-I, and FIG. 4C is a cross-section view of the light-emitting device 100b taken along plane II-II. The same features of the configuration of the light-emitting device 100b illustrated in FIGS. 4A, 4B, and 4C as those of the configurations of the light-emitting device 100 illustrated in FIGS. 1A and 1B and the light-emitting device 100a illustrated in FIG. 2 will be referred to with the same signs as those of the configurations of the light-emitting device 100 and the light-emitting device 100a, and detailed explanation for those same features will not be repeated.

The light-emitting device 100b illustrated in FIGS. 4A, 4B, and 4C include the capacitor 10a, and the solid-state light-emitting element 20, a semiconductor switch 30a, and a clamp diode 40 that are placed on the outer face of the capacitor 10a. The capacitor 10a is a capacitor for electric power supply and is a multilayer ceramic capacitor. Thus, the capacitor 10a is configured to be a multilayer body in which the plurality of inner electrodes 14 and 15 for acquiring electrostatic capacitance and the dielectric ceramic layer 13 are laminated in an alternate manner.

In the capacitor 10a, as illustrated in FIGS. 4B and 4C, the via conductors 16 and 17 that penetrate through the multilayer body are formed. The via conductor 16 allows the outer electrode 11 formed on the outer face of the capacitor 10a and the laminated inner electrodes 14 to be electrically connected to each other. The via conductor 17 allows the outer electrode 12 formed on the outer face of the capacitor 10a and the laminated inner electrodes 15 to be electrically connected to each other.

One electrode (for example, a cathode) of the solid-state light-emitting element 20 is connected to the outer electrode 11, and another electrode (for example, an anode) of the solid-state light-emitting element 20 is electrically connected to the wiring 21. The wiring 21 allows the solid-state light-emitting element 20 and the connecting electrode 32 to be electrically connected to each other. A material, such as Au, Al, or Cu may be used as a material for the wiring 21. Furthermore, the wiring 21 may have a shape, such as a wire, a ribbon, or a clip.

Apart from the solid-state light-emitting element 20, one electrode (for example, an anode) of the clamp diode 40 is electrically connected to the outer electrode 11. The clamp diode 40 is connected in parallel to the solid-state light-emitting element 20, and another electrode (for example, a cathode) of the clamp diode 40 is electrically connected to wiring 41. The wiring 41 allows the clamp diode 40 and the connecting electrode 32 to be electrically connected to each other. A material, such as Au, Al, or Cu may be used as a material for the wiring 41.

One electrode (for example, a source electrode) and another electrode (for example, a drain electrode) of the semiconductor switch 30a are formed on the same face. Thus, the one electrode (for example, the source electrode) of the semiconductor switch 30a is connected to the connecting electrode 32, and the other electrode (for example, the drain electrode) of the semiconductor switch 30a is electrically connected to the outer electrode 12.

Figure 5:
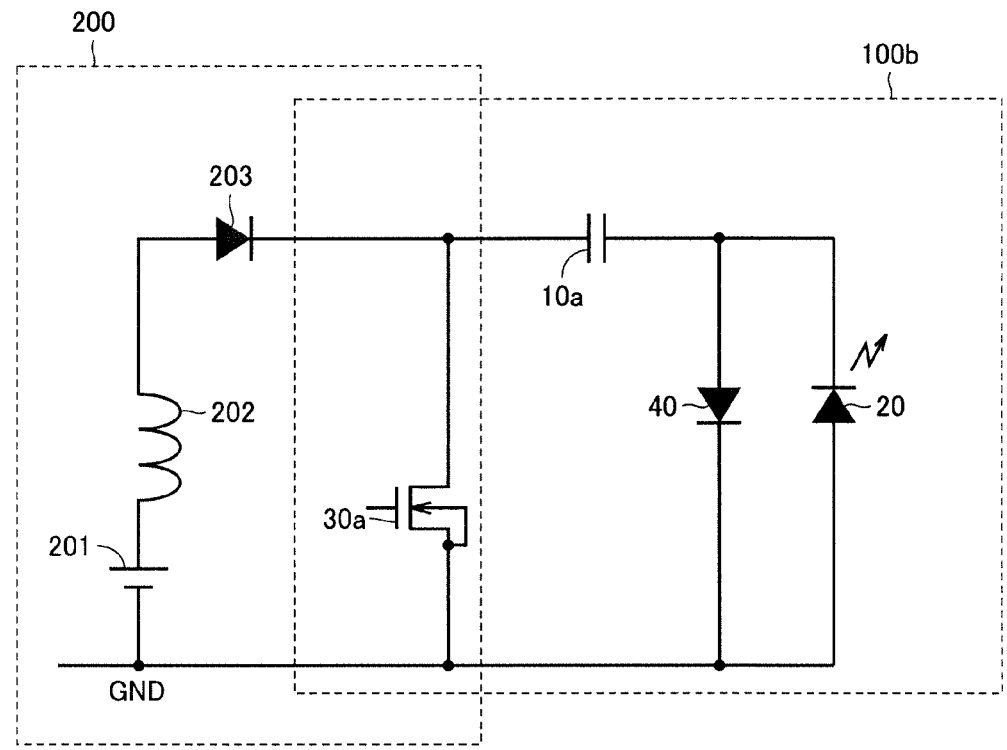
FIG. 5 is a circuit diagram of the light-emitting device according to the third embodiment of the present disclosure.

FIG. 5 is a circuit diagram of the light-emitting device 100b according to the third embodiment of the present disclosure. In the circuit diagram illustrated in FIG. 5, one electrode (cathode) of the solid-state light-emitting element 20 and one electrode (anode) of the clamp diode 40 are connected to one electrode of the capacitor 10a. Another electrode of the capacitor 10a is connected to one electrode (drain electrode) of the semiconductor switch 30a. Another electrode (anode) of the solid-state light-emitting element 20, another electrode (cathode) of the clamp diode 40, and another electrode (source electrode) of the semiconductor switch 30a are connected to GND wiring.

The semiconductor switch 30a used for the light-emitting device 100b is also used as a semiconductor switch used for a booster circuit 200. Thus, the booster circuit 200 is configured to include the semiconductor switch 30a of the light-emitting device 100b, as well as a DC power supply 201, an inductor 202, and a diode 203. That is, the light-emitting device 100b has a configuration in which the semiconductor switch used for the booster circuit 200 is also placed on the outer face of the capacitor 10a.

As described above, in the light-emitting device 100b according to the third embodiment, the clamp diode 40 is connected in parallel to the solid-state light-emitting element 20 and is placed on the outer face of the capacitor 10a. Thus, by shortening a current loop, the parasitic inductance can be reduced, and light with a short pulse can also be output from the solid-state light-emitting element 20. The light-emitting device 100b that uses a multilayer ceramic capacitor as the capacitor 10a has been described above. However, a similar configuration may also be used for other types of capacitor (for example, a semiconductor capacitor) described below.

Fourth Embodiment

In the light-emitting device 100b according to the third embodiment, the clamp diode 40 is present on an optical path for the light-emitting unit 22 of the solid-state light-emitting element 20 on the side near the clamp diode 40, as illustrated in FIG. 4A. Therefore, light emitted from the light-emitting unit 22 may be blocked by the clamp diode 40. Thus, in a fourth embodiment of the present disclosure, an arrangement of elements not blocking an optical path of light emitted from the light-emitting unit 22 of the solid-state light-emitting element 20 will be described.

Figure 6:
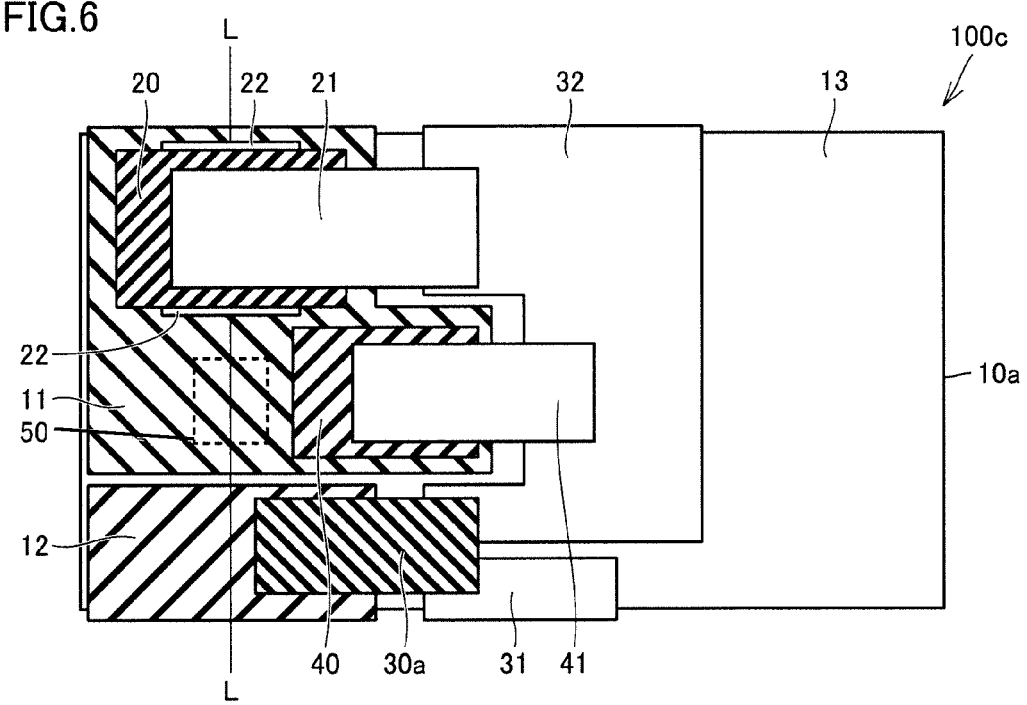
FIG. 6 is a schematic diagram for explaining a configuration of a light-emitting device according to a fourth embodiment of the present disclosure.

FIG. 6 is a schematic diagram for explaining a configuration of a light-emitting device 100c according to the fourth embodiment of the present disclosure. A plan view illustrated in FIG. 6 is a plan view of the light-emitting device 100c when viewed from the outer face of the capacitor 10a on which the solid-state light-emitting element 20 is placed. The same features of the configuration of the light-emitting device 100c illustrated in FIG. 6 as those of the configuration of the light-emitting device 100b illustrated in FIGS. 4A, 4B, and 4C will be referred to with the same signs as those of the configuration of the light-emitting device 100b, and detailed explanation for those same features will not be repeated.

The solid-state light-emitting element 20 is a light-emitting element of an edge light emission type including the light-emitting unit 22 that emits light in a direction parallel to the outer face of the capacitor 10a. Thus, the light-emitting device 100c is able to output light in the direction parallel to the outer face of the capacitor 10a. However, the light-emitting device 100c needs to be arranged such that light emitted from the light-emitting unit 22 is not blocked by other elements (for example, a semiconductor switch, a clamp diode, or the like).

The light-emitting device 100c illustrated in FIG. 6 includes the capacitor 10a, and the solid-state light-emitting element 20, the semiconductor switch 30a, and the clamp diode 40 that are placed on the outer face of the capacitor 10a. Furthermore, the light-emitting device 100c is arranged such that the position of the clamp diode 40 is shifted to the right side on the drawing compared to the light-emitting device 100b illustrated in FIGS. 4A, 4B, and 4C. Thus, other elements are not present at a position that blocks an optical path L of light emitted from the light-emitting unit 22.

In particular, in the case where a light-emitting device has a configuration in which a light-receiving element, such as a photodiode detects emission or non-emission of light, a place for the light-receiving element needs to be secured on an optical path L of light. In the light-emitting device 100c illustrated in FIG. 6, the clamp diode 40 and the semiconductor switch 30a are arranged with being shifted to the right side on the drawing. Thus, for example, a light-receiving element 50 may be placed at a position on the outer electrode 11 that blocks the optical path L of light. Furthermore, even in the case where a light-emitting device has a configuration in which emission or non-emission of light is not detected by a light-receiving element, if another element is present at a position that blocks the optical path L, emitted light may be reflected by the other element and return to the solid-state light-emitting element 20, which may adversely affect a resonance operation inside the solid-state light-emitting element 20. Thus, in order to avoid such an adverse influence, it is desirable that other elements not present on the optical path L.

As an arrangement method for preventing light emitted from the light-emitting unit 22 from being blocked by other elements, apart from the arrangement of the light-emitting device 100c illustrated in FIG. 6 in which another element is shifted in the horizontal direction relative to the solid-state light-emitting element 20 on the outer face of the capacitor, an arrangement method for shifting another element in the vertical direction is also possible.

Figure 7A:
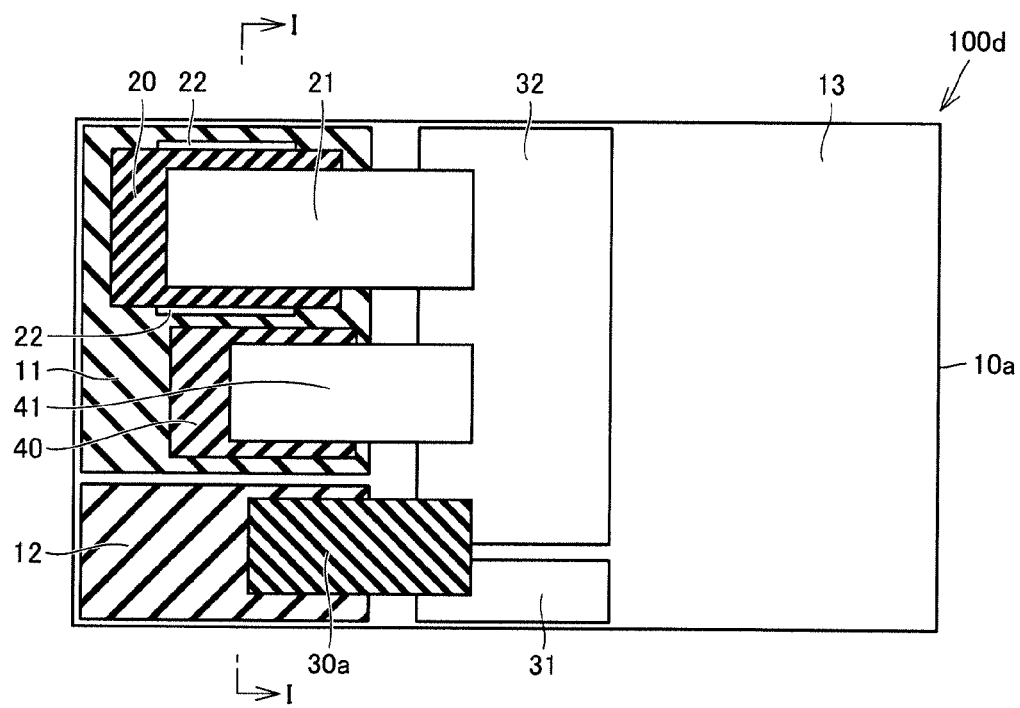
FIGS. 7A and 7B include schematic diagrams for explaining another configuration of a light-emitting device according to the fourth embodiment of the present disclosure.
Figure 7B:
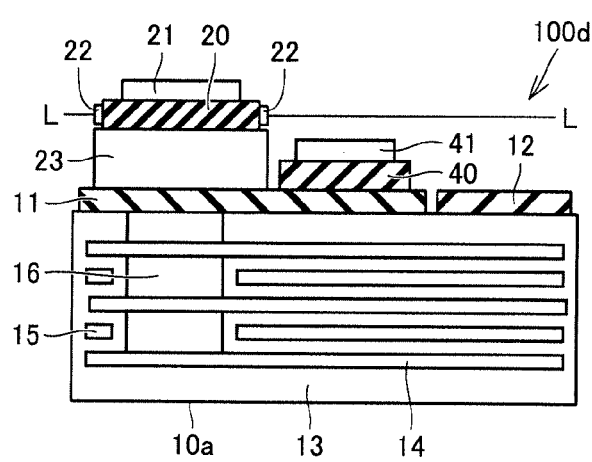

FIGS. 7A and 7B include schematic diagrams for explaining a configuration of a light-emitting device 100d according to the fourth embodiment of the present disclosure. FIG. 7A is a plan view of the light-emitting device 100d when viewed from the outer face of the capacitor 10a on which the solid-state light-emitting element 20 is placed, and FIG. 7B is a cross-section view of the light-emitting device 100d taken along plane I-I. The same features of the configuration of the light-emitting device 100d illustrated in FIGS. 7A and 7B as those of the configurations of the light-emitting device 100b illustrated in FIGS. 4A, 4B, and 4C and the light-emitting device 100c illustrated in FIG. 6 will be referred to with the same signs as those of the configurations of the light-emitting device 100b and the light-emitting device 100c, and detailed explanation for those same features will not be repeated.

The solid-state light-emitting element 20 is a light-emitting element of an edge light emission type including the light-emitting unit 22 that emits light in a direction parallel to the outer face of the capacitor 10a. Thus, the light-emitting device 100d is able to output light in the direction parallel to the outer face of the capacitor 10a. However, the light-emitting device 100d needs to be arranged such that light emitted from the light-emitting unit 22 is not blocked by other elements (for example, a semiconductor switch, a clamp diode, or the like). Thus, in the light-emitting device 100d, a metal plate 23 is placed on the outer electrode 11 and the solid-state light-emitting element 20 is placed on the metal plate 23. That is, the face on which the solid-state light-emitting element 20 is mounted is lifted in the vertical direction relative to the face on which other elements are mounted. Thus, As illustrated in FIG. 7B, other elements are not present at a position that blocks the optical path L of light emitted from the light-emitting unit 22.

The metal plate 23 may be any joining material that allows the outer electrode 11 and one electrode (for example, a cathode) of the solid-state light-emitting element 20 to be electrically connected to each other. Furthermore, the metal plate 23 may have any thickness that is thick enough to prevent the optical path L of light emitted from the solid-state light-emitting element 20 from being blocked by other elements.

As described above, in the light-emitting devices 100c and 100d according to the fourth embodiment, the solid-state light-emitting element 20 is able to emit light in the direction that is horizontal to the outer face of the capacitor 10a, and the emitted light can be prevented from being blocked by other components placed on the capacitor 10a. That is, other components placed on the outer face of the capacitor 10a are placed on the outer face of the capacitor to avoid the optical path L of light emitted from the solid-state light-emitting element 20. As other components placed on the outer face of the capacitor 10a are, for example, the semiconductor switch 30a, the clamp diode 40, and the like.

For example, the semiconductor switch 30a is arranged with being shifted in the horizontal direction relative to the solid-state light-emitting element 20 on the outer face of the capacitor 10a, as illustrated in FIG. 6. Furthermore, the semiconductor switch 30a is arranged with being shifted in the vertical direction relative to the solid-state light-emitting element 20 on the outer face of the capacitor 10a, as illustrated in FIGS. 7A and 7B. With such arrangement, other elements (for example, a semiconductor switch, a clamp diode, and the like) are not arranged on the optical path L for the solid-state light-emitting element 20. Thus, a light-receiving element, such as a photodiode may be arranged.

The light-emitting devices 100c and 100d may further include the light-receiving element 50 that receives light from the solid-state light-emitting element 20 on the optical path L of light emitted from the solid-state light-emitting element 20. In the case where other elements are present on the optical path L for the solid-state light-emitting element 20, the light-receiving element 50 needs to be arranged in front of the other elements or light needs to be reflected so that the light-receiving element 50 can detect the light. In the case where the light-receiving element 50 is arranged in front of another element, a connection wire needs to be installed, and the parasitic inductance of a current loop thus increases. Furthermore, in order that light is reflected so that the light can be detected by the light-receiving element 50, a component, such as a mirror needs to be installed. Thus, the cost of the light-emitting device increases, and the size also increases. The light-receiving element 50 may not be placed on the outer face of the capacitor 10a. The light-emitting devices 100c and 100d that use a multilayer ceramic capacitor as the capacitor 10a have been described above. However, a similar configuration may also be used for other types of capacitor (for example, a semiconductor capacitor) described below.

Fifth Embodiment

In the light-emitting device 100 according to the first embodiment, as illustrated in FIG. 1B, the capacitor 10 is a multilayer ceramic capacitor. In a fifth embodiment of the present disclosure, a case where capacitor of a type different from a multilayer ceramic capacitor is used as a capacitor will be described. For example, a case where a semiconductor capacitor is used will be described. However, a semiconductor capacitor is not necessarily used as the capacitor.

Figure 8A:
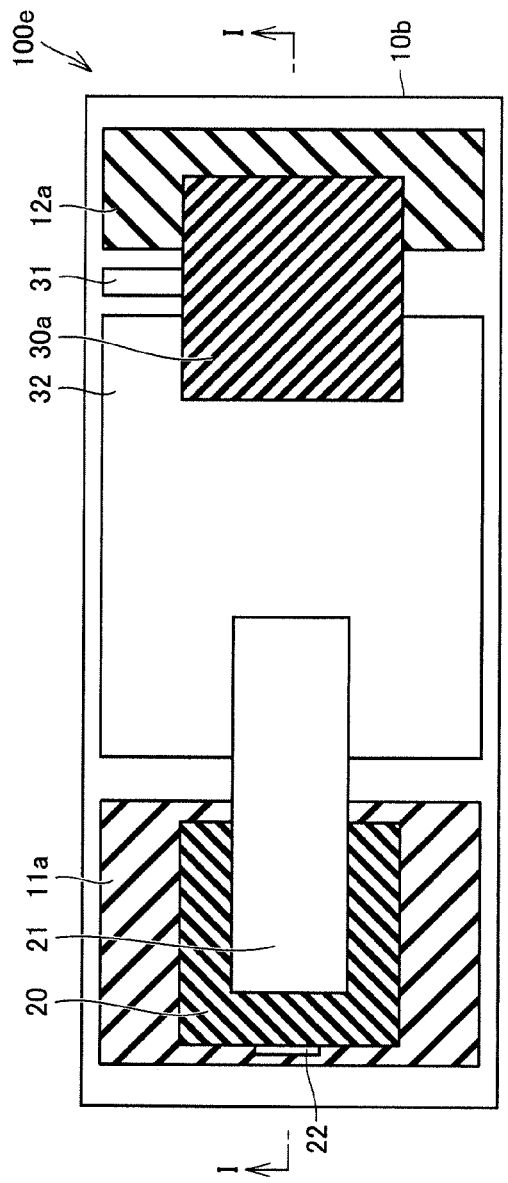
FIGS. 8A and 8B include schematic diagrams for explaining a configuration of a light-emitting device according to a fifth embodiment of the present disclosure.
Figure 8B:
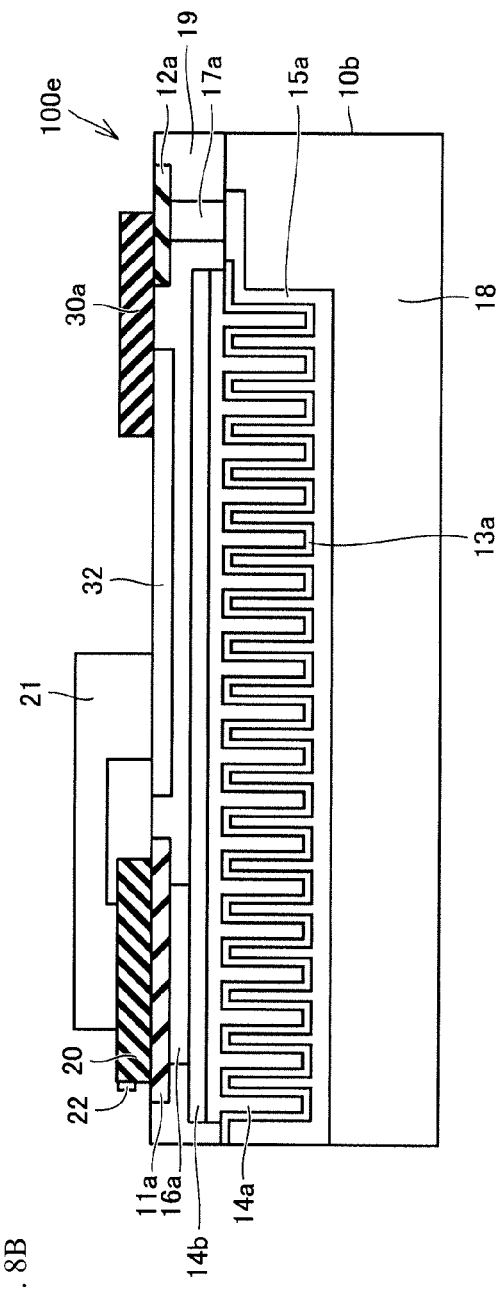

FIGS. 8A and 8B include schematic diagrams for explaining a configuration of a light-emitting device 100e according to the fifth embodiment of the present disclosure. FIG. 8A is a plan view of the light-emitting device 100e when viewed from the outer face of a capacitor 10b on which the solid-state light-emitting element 20 is placed, and FIG. 8B is a cross-section view of the light-emitting device 100e taken along plane I-I. The same features of the configuration of the light-emitting device 100e illustrated in FIGS. 8A and 8B as those of the configurations of the light-emitting device 100 illustrated in FIGS. 1A and 1B and the light-emitting device 100a illustrated in FIGS. 3A, 3B, and 3C will be referred to with the same signs as those of the configurations of the light-emitting device 100 and the light-emitting device 100a, and detailed explanation for those same features will not be repeated.

The light-emitting device 100e illustrated in FIGS. 8A and 8B include the capacitor 10b, and the solid-state light-emitting element 20 and the semiconductor switch 30a that are placed on the outer face of the capacitor 10b. The capacitor 10b is a capacitor for electric power supply and is a semiconductor capacitor. The capacitor 10b includes an N+ layer 15a that is formed by a semiconductor process and formed by injecting n-type impurity ion into a silicon substrate 18, a dielectric layer 13a that is formed on the surface of the N+ layer 15a by, for example, a CVD (Chemical Vapor Deposition) method and is made of, for example, an inorganic material, such as silicon oxide, silicon nitride, hafnium oxide, hafnium silicate, alumina, or barium titanate, and a conductive polysilicon layer 14a formed on the surface of the dielectric layer 13a by the CVD method. Although the case where a substrate forming the capacitor 10b is the silicon substrate 18 has been described above, other types of substrate, such as a sapphire substrate or a GaAs substrate may be used.

The N+ layer 15a is a low-resistivity layer formed by injecting n-type impurity ion at high concentration into a surface of the silicon substrate 18 with a recessed and projected shape formed by forming a plurality of trenches or a plurality of pillars into the silicon substrate 18. This is because the area of the dielectric layer 13a sandwiched between the N+ layer 15a and the polysilicon layer 14a is increased so that the capacitance of the capacitor can be increased. Thus, the number and size of trenches or pillars formed at the silicon substrate 18 are designed according to the capacitance suitable for the capacitor 10b. The configuration of the capacitor 10b is merely an example, and the above-mentioned configuration is not necessarily adopted. Furthermore, as explained above with reference to FIG. 8B, the dielectric layer 13a is a single layer. However, the dielectric layer 13a may include a plurality of layers made of the same material or different materials. Furthermore, an example of the capacitor 10b in which the N+ layer 15a is formed by injecting n-type impurity ion into the silicon substrate 18 has been explained above. However, a P+ layer may be formed by injecting p-type impurity ion into the silicon substrate 18 according to the circuit configuration or manufacturing.

The polysilicon layer 14a is used as one electrode (first inner electrode) that forms the capacitance of the capacitor 10b. A metal layer 14b is formed above the polysilicon layer 14a so that the resistivity of the one electrode formed by the polysilicon layer 14a can be reduced. If a required resistivity can be obtained only with the polysilicon layer 14a, the metal layer 14b is not necessarily formed. In the case where the metal layer 14b is formed above the polysilicon layer 14a, the polysilicon layer 14a is electrically connected to an outer electrode 11a with a via conductor 16a interposed therebetween. Although the one electrode (first inner electrode) that forms the capacitance of the capacitor 10b is formed by the polysilicon layer 14a, the electrode may be formed by a metal layer or the like.

The N+ layer 15a is used as another electrode (second inner electrode) the forms the capacitance of the capacitor 10b. The N+ layer 15a is electrically connected to an outer electrode 12a with a via conductor 17a interposed therebetween.

The outer electrodes 11a and 12a are electrodes that allow the solid-state light-emitting element 20 and the semiconductor switch 30a to be placed on the outer face of the capacitor 10b. Specifically, in the capacitor 10b illustrated in FIGS. 8A and 8B, the outer electrode 11a is formed on the outer face of the capacitor 10b on the left side on the drawing, and the outer electrode 12a is formed on the outer face of the capacitor 10b on the right side on the drawing. Furthermore, the gate extended electrode 31 and the connecting electrode 32 are formed between the outer electrodes 11a and 12a on the outer face of the capacitor 10b.

One electrode (for example, an anode) of the solid-state light-emitting element 20 is connected to the outer electrode 11a, and another electrode (for example, a cathode) of the solid-state light-emitting element 20 is electrically connected to the wiring 21. The wiring 21 allows the solid-state light-emitting element 20 and the connecting electrode 32 to be electrically connected to each other.

One electrode (for example, a drain electrode) of the semiconductor switch 30a is connected to the connecting electrode 32, and another electrode (for example, a source electrode) of the semiconductor switch 30a is electrically connected to the outer electrode 12a. The circuit configuration of the light-emitting device 100e is the same as the circuit configuration illustrated in FIG. 2. However, the configuration of the semiconductor capacitor explained above may be applied to the circuit configuration illustrated in FIG. 5.

In the light-emitting device 100e, after an insulating film 19 made of, for example, silicon oxide or silicon nitride with a thickness of 100 μm or less is formed on the metal layer 14b, the outer electrodes 11a and 12a, the connecting electrode 32, and the via conductors 16a and 17a are formed by a semiconductor process. Thus, in the light-emitting device 100e, the distance between the capacitor 10b and the outer electrodes 11a and 12a can further be shortened by fine processing, and the current loop can further be shortened compared to the case where the solid-state light-emitting element 20 and the semiconductor switch 30a are mounted on the outer face of a multilayer ceramic capacitor. Although not illustrated in the drawings, a passivation layer is formed as a protection film in an area of the outer face of the capacitor 10b other than a part in which the solid-state light-emitting element 20 and the outer electrode 11a are connected, a part in which the semiconductor switch 30a and the outer electrode 12a are connected, and a part in which the connecting electrode 32 and the wiring 21 are connected. Furthermore, as explained above with reference to FIG. 8B, the insulating film 19 is made of an inorganic material, such as silicon oxide or silicon nitride. However, as described later, instead of forming an insulating film or a wiring layer in a pre-process of a semiconductor manufacturing, the insulating film 19 may be formed to be combined with an insulating film made of an organic material, such as polyimide or a resin, as illustrated in FIG. 16B, so that the insulating film or the wiring layer can be formed in a re-wiring process. Furthermore, with provision of the insulating film 19, parasitic capacitance is generated between the metal layer 14b and the connecting electrode 32. Thus, a material of the insulating film 19 is selected such that the permittivity of the insulating film 19 is lower than the permittivity of the dielectric layer 13a, and an influence of the parasitic capacitance on driving of the solid-state light-emitting element 20 can thus be reduced.

As described above, in the light-emitting device 100e according to the fifth embodiment, the capacitor 10b is a semiconductor capacitor that includes the dielectric layer 13a, the polysilicon layer 14a (first inner electrode), and the N+ layer 15a (second inner electrode) in the silicon substrate 18 (semiconductor substrate), and the polysilicon layer 14a and the N+ layer 15a are arranged with the dielectric layer 13a interposed therebetween. Furthermore, the semiconductor capacitor includes the insulating film 19 with a thickness of 100 μm or less on the outer face of the capacitor, and includes the connecting electrode 32 (conductive part) provided on the outer face of the capacitor 10b with the insulating film 19 interposed therebetween. Thus, the current loop of the light-emitting device 100e can be shorted compared to the case where elements are mounted on the outer face of a multilayer ceramic capacitor, and the parasitic inductance of the current loop can further be reduced. In addition, light with a short pulse can be output from the solid-state light-emitting element 20.

Furthermore, in the semiconductor capacitor, the dielectric layer 13a is formed in the vertical direction relative to the outer face of the capacitor 10b on which the solid-state light-emitting element 20 and the semiconductor switch 30a are placed. That is, the semiconductor capacitor has a structure in which a plurality of trenches or a plurality of pillars are formed at the silicon substrate 18, a low-resistivity layer is formed by injecting n-type impurity ion at high concentration into the formed plurality of trenches or plurality of pillars, and the dielectric layer 13a is formed on the surface of the low-resistivity layer and is sandwiched between the polysilicon layer 14a (first inner electrode) and the N+ layer 15a (second inner electrode). As described above, the capacitor 10b, which is a semiconductor capacitor, is provided with an area of a recessed and projected shape, as illustrated in FIG. 8B, and the capacitance of the capacitor 10b can thus be ensured.

Sixth Embodiment

In the light-emitting device 100e according to the fifth embodiment, the capacitor 10b is a semiconductor capacitor, as illustrated in FIG. 8B. In the capacitor 10b, the area with a recessed and projected shape that forms capacitance is provided all faces of the capacitor 10b including the rear face of the solid-state light-emitting element 20 and the semiconductor switch 30a. In a sixth embodiment of the present disclosure, a configuration will be explained in which an area with a recessed and projected shape that forms capacitance of a capacitor is not provided but a metal layer, a polysilicon layer, a silicon substrate, and the like are provided at a position corresponding to the rear face of the solid-state light-emitting element 20 and the semiconductor switch 30a. For example, a case where a semiconductor capacitor is used will be described below. However, a semiconductor capacitor is not necessarily used as the capacitor.

Figure 9A:
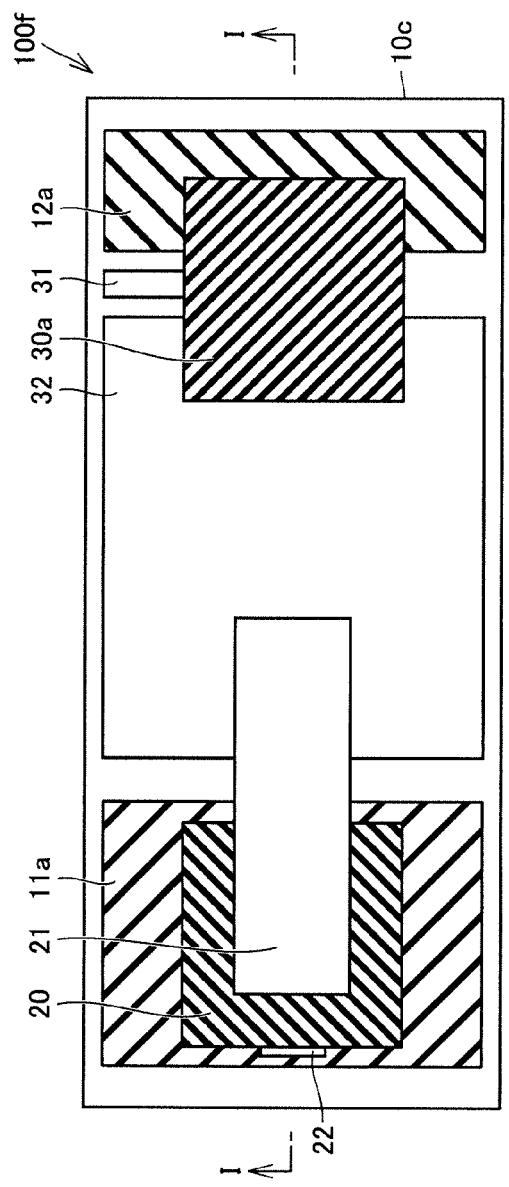
FIGS. 9A and 9B include schematic diagrams for explaining a configuration of a light-emitting device according to a sixth embodiment of the present disclosure.
Figure 9B:
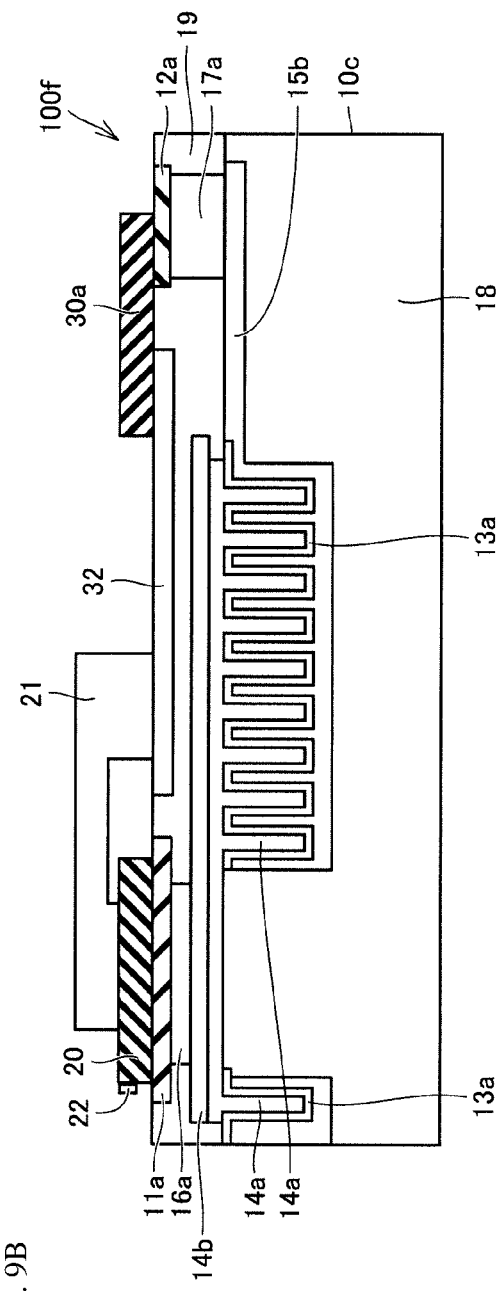

FIGS. 9A and 9B include schematic diagrams for explaining a configuration of a light-emitting device 100f according to the sixth embodiment of the present disclosure. FIG. 9A is a plan view of the light-emitting device 100f when viewed from the outer face of a capacitor 10c on which the solid-state light-emitting element 20 is placed, and FIG. 9B is a cross-section view of the light-emitting device 100f taken along plane I-I. The same features of the configuration of the light-emitting device 100f illustrated in FIGS. 9A and 9B as those of the configurations of the light-emitting device 100 illustrated in FIGS. 1A and 1B, the light-emitting device 100a illustrated in FIGS. 3A, 3B, and 3C, and the light-emitting device 100e illustrated in FIGS. 8A and 8B will be referred to with the same signs as those of the configurations of the light-emitting device 100, the light-emitting device 100a, and the light-emitting device 100e, and detailed explanation for those same features will not be repeated.

The light-emitting device 100f illustrated in FIGS. 9A and 9B include the capacitor 10c, and the solid-state light-emitting element 20 and the semiconductor switch 30a that are placed on the outer face of the capacitor 10c. The capacitor 10c is a capacitor for electric power supply and is a semiconductor capacitor. The capacitor 10c has the same structure as that of the capacitor 10b illustrated in FIGS. 8A and 8B with the exception that an area with a recessed and projected shape that forms capacitance of a capacitor is not provided but only the metal layer 14b, the polysilicon layer 14a, and the silicon substrate 18 are placed at a position corresponding to the rear face of the solid-state light-emitting element 20 and the semiconductor switch 30a in the capacitor 10c, as illustrated in FIG. 9B.

The dielectric layer 13a has a thermal conductivity lower than that of the metal layer 14b, the polysilicon layer 14a (first inner electrode), and the silicon substrate 18. In the capacitor 10b illustrated in FIGS. 8A and 8B, the dielectric layer 13a is always provided in the area with the recessed and projected shape that forms capacitance. Therefore, it is difficult to release heat from the solid-state light-emitting element 20 and the semiconductor switch 30a serving as a heat generation source.

Thus, in the light-emitting device 100f, an area with a recessed and projected shape that forms capacitance of the capacitor 10c is not provided at a position corresponding to the rear face of the solid-state light-emitting element 20 and the semiconductor switch 30a, so that a dielectric, an insulating film, and air are not arranged. In the capacitor 10c, instead of providing the area with the recessed and projected shape, a projected part of the silicon substrate 18 is provided which is arranged immediately below the position at which the solid-state light-emitting element 20 and the semiconductor switch 30a are placed and laterally to a capacitance forming part including the dielectric layer 13a and the polysilicon layer 14a (first inner electrode) and a P+ layer 15b (second inner electrode) that are provided to sandwich the dielectric ceramic layer 13 therebetween. The relationship of thermal conductivity is expressed by metal>silicon, polysilicon>dielectric>insulating film>air. Heat dissipation increases as the width of the via conductor 17 that allows connection between the P+ layer 15b and the outer electrode 12a increases. In order to ensure insulation between the silicon substrate 18 and the second inner electrode of the capacitor 10c, the polarity of the silicon substrate 18 and the polarity of the second need to be opposite. In order to prevent current from flowing to parasitic diode generated at that time, a circuit configuration that applies reverse bias needs to be provided. In the sixth embodiment, to match the circuit configuration described above, a configuration in which the P+ layer 15b is provided as the second inner electrode of the capacitor 10c so that reverse bias is applied to the parasitic diode is provided.

As described above, in the light-emitting device 100f according to the sixth embodiment, the semiconductor capacitor as the capacitor 10c includes a projected part of the silicon substrate 18 (semiconductor substrate) that is arranged immediately below the position at which the solid-state light-emitting element 20 and the semiconductor switch 30a are placed and laterally to the capacitance forming part including the dielectric layer 13a and the polysilicon layer 14a (first inner electrode) and the P+ layer 15b (second inner electrode) that sandwich the dielectric layer 13a therebetween. Thus, with a configuration in which an area with a recessed and projected shape including the dielectric layer 13a having a thermal conductivity lower than that of the polysilicon layer 14a is not provided but a projected part of the silicon substrate 18 having a thermal conductivity higher than that of the dielectric layer 13a is provided, the light-emitting device 100f can easily release heat to the rear face of the silicon substrate 18, compared to the case where the dielectric layer 13a is present on the rear face of the solid-state light-emitting element 20 and the semiconductor switch 30a.

(Modification)

The polysilicon layer 14a has a thermal conductivity higher than that of the dielectric layer 13a. Thus, a configuration may be provided in which the dielectric layer 13a is not provided in an area in which the capacitance of the capacitor is formed but only an area with a recessed and projected shape of the polysilicon layer 14a is provided at the silicon substrate 18 immediately below the position at which the solid-state light-emitting element 20 and the semiconductor switch 30a are placed.

Figure 10A:
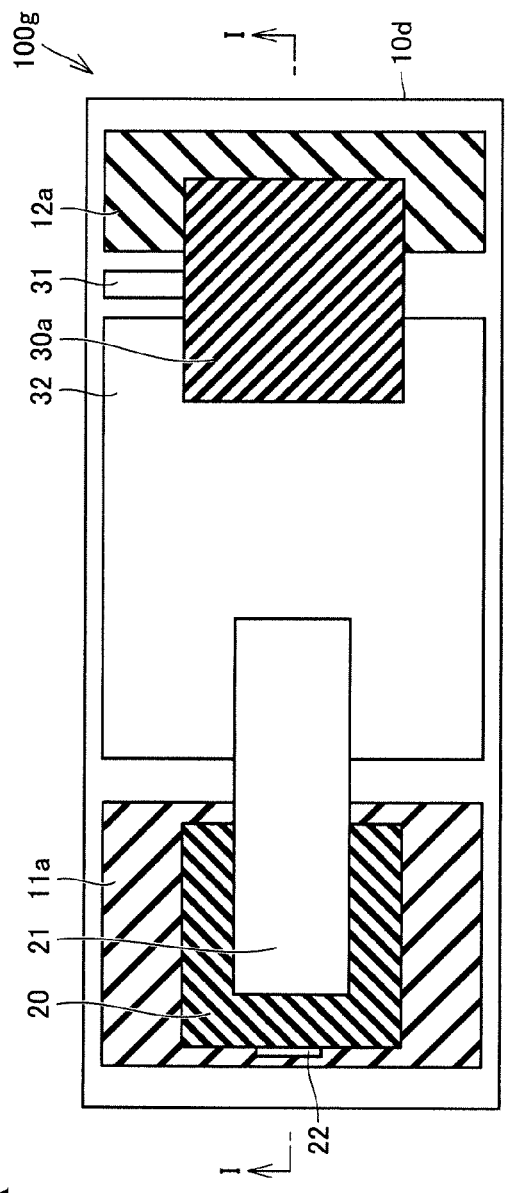
FIGS. 10A and 10B include schematic diagrams for explaining a configuration of a light-emitting device according to a modification of the sixth embodiment of the present disclosure.
Figure 10B:
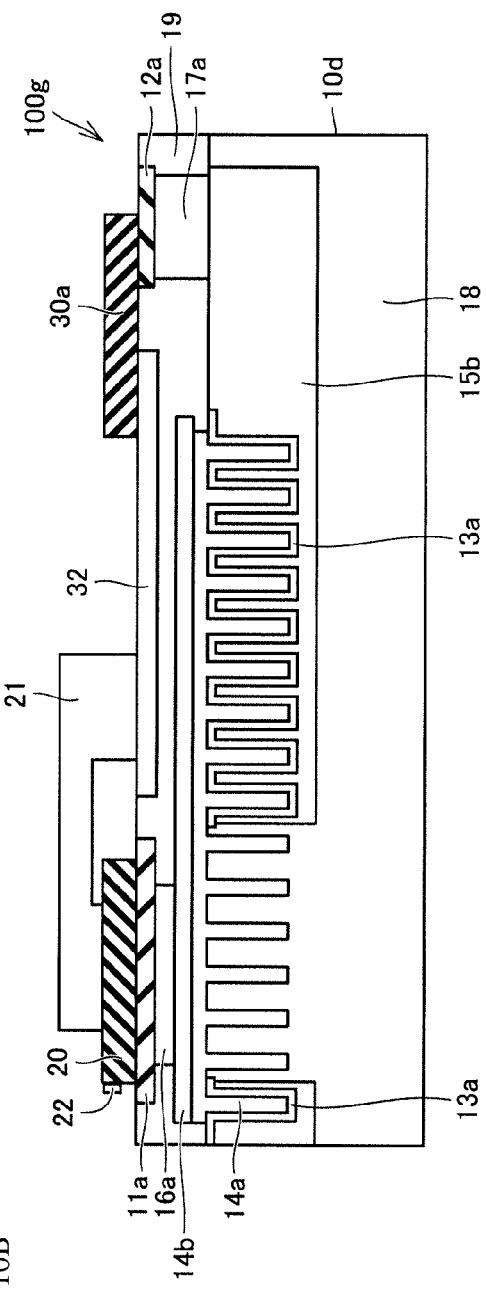

FIGS. 10A and 10B include schematic diagrams for explaining a configuration of a light-emitting device 100g according to a modification of the sixth embodiment of the present disclosure. FIG. 10A is a plan view of the light-emitting device 100g when viewed from the outer face of a capacitor 10d on which the solid-state light-emitting element 20 is placed, and FIG. 10B is a cross-section view of the light-emitting device 100g taken along plane I-I. The same features of the configuration of the light-emitting device 100g illustrated in FIGS. 10A and 10B as those of the configurations of the light-emitting device 100 illustrated in FIGS. 1A and 1B, the light-emitting device 100a illustrated in FIGS. 3A, 3B, and 3C, and the light-emitting device 100e illustrated in FIGS. 8A and 8B will be referred to with the same signs as those of the configurations of the light-emitting device 100, the light-emitting device 100a, and the light-emitting device 100e, and detailed explanation for those same features will not be repeated.

The light-emitting device 100g illustrated in FIGS. 10A and 10B include the capacitor 10d, and the solid-state light-emitting element 20 and the semiconductor switch 30a that are placed on the outer face of the capacitor 10d. The capacitor 10d is a capacitor for electric power supply and is a semiconductor capacitor. The capacitor 10d has the same structure as that of the capacitor 10b illustrated in FIGS. 8A and 8B with the exception that the dielectric layer 13a is not provided but a part in which only a recessed and projected shape of the polysilicon layer 14a is provided at a position corresponding to the rear face of the solid-state light-emitting element 20 and the semiconductor switch 30a in the capacitor 10d, as illustrated in FIG. 10B. That is, a part in which only the polysilicon layer 14a and the silicon substrate 18 are provided is provided at a position corresponding to the rear face of the solid-state light-emitting element 20 and the semiconductor switch 30a.

As described above, in the light-emitting device 100g according to the modification of the sixth embodiment, the semiconductor capacitor as the capacitor 10d does not include the dielectric layer 13a but includes a part in which only the polysilicon layer 14a, the metal layer 14b, and the silicon substrate 18 are provided immediately below the position at which the solid-state light-emitting element 20 and the semiconductor switch 30a are placed. Accordingly, the light-emitting device 100g includes a part with a recessed and projected shape in which the dielectric layer 13a having a thermal conductivity lower than that of the polysilicon layer 14a is not provided, and the light-emitting device 100g can easily release heat to the rear face of the silicon substrate 18, compared to the case where the dielectric layer 13a is present on the rear face of the solid-state light-emitting element 20 and the semiconductor switch 30a.

Seventh Embodiment

In the light-emitting device 100f according to the sixth embodiment, as illustrated in FIG. 9B, at the position corresponding to the rear face of the solid-state light-emitting element 20 and the semiconductor switch 30a, a part with a recessed and projected shape that forms the capacitance of the capacitor 10c is not provided but a projected part of the silicon substrate 18 is arranged. In a seventh embodiment of the present disclosure, a configuration in which a via conductor is further provided at the position corresponding to the rear face of the solid-state light-emitting element 20 and the semiconductor switch 30a will be described. For example, a case where a semiconductor capacitor is used will be described below. However, a semiconductor capacitor is not necessarily used as the capacitor.

Figure 11A:
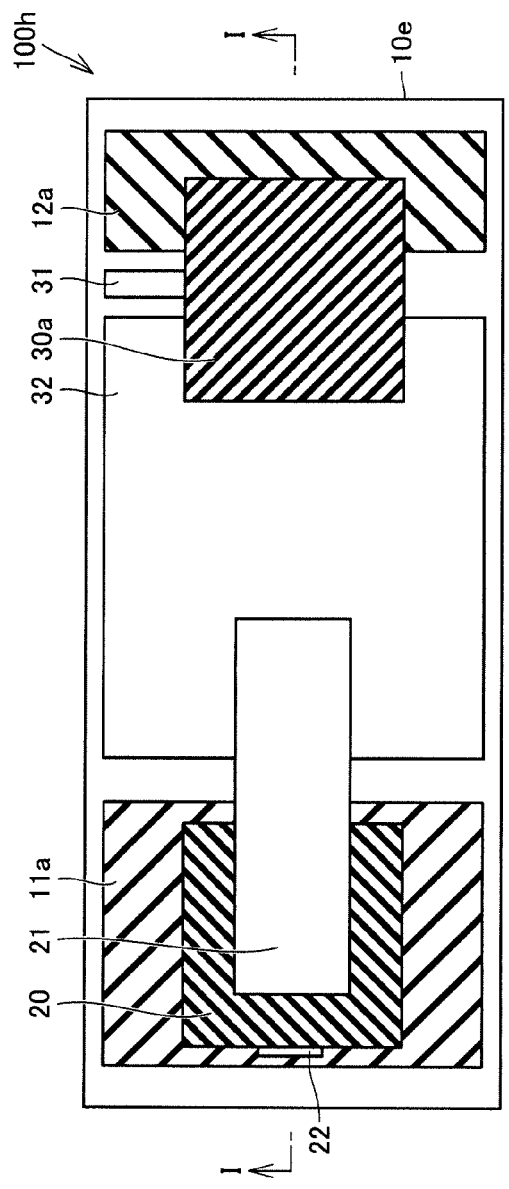
FIGS. 11A and 11B include schematic diagrams for explaining a configuration of a light-emitting device according to a seventh embodiment of the present disclosure.
Figure 11B:
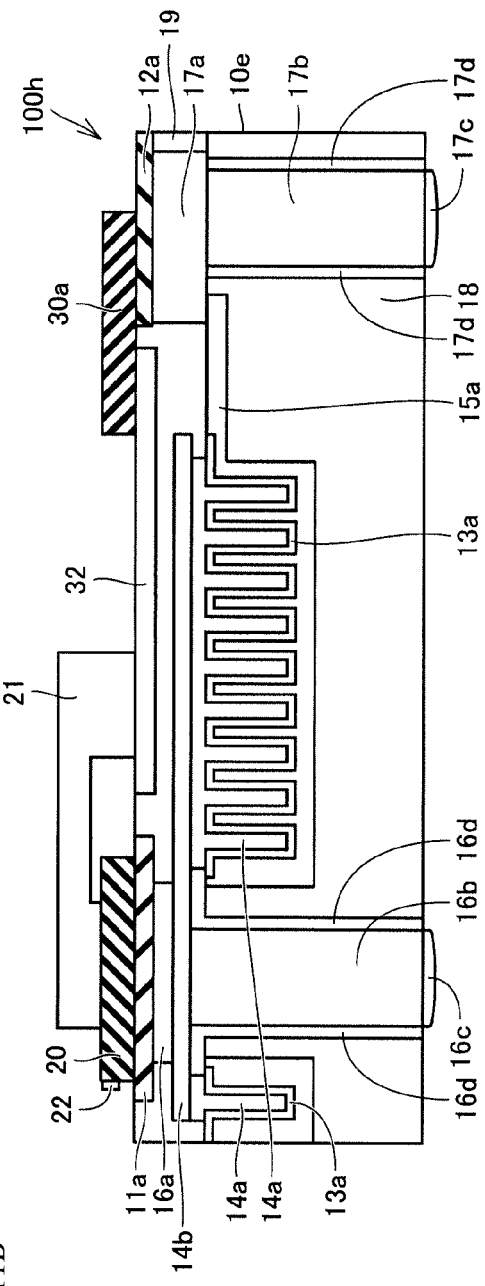

FIGS. 11A and 11B include schematic diagrams for explaining a configuration of a light-emitting device 100h according to the seventh embodiment of the present disclosure. FIG. 11A is a plan view of the light-emitting device 100h when viewed from the outer face of capacitor 10e on which the solid-state light-emitting element 20 is placed, and FIG. 11B is a cross-section view of the light-emitting device 100h taken along plane I-I. The same features of the configuration of the light-emitting device 100h illustrated in FIGS. 11A and 11B as those of the configurations of the light-emitting device 100 illustrated in FIGS. 1A and 1B, the light-emitting device 100a illustrated in FIGS. 3A, 3B, and 3C, and the light-emitting device 100f illustrated in FIGS. 9A and 9B will be referred to with the same signs as those of the configurations of the light-emitting device 100, the light-emitting device 100a, and the light-emitting device 100f, and detailed explanation for those same features will not be repeated.

The light-emitting device 100h illustrated in FIGS. 11A and 11B include the capacitor 10e, and the solid-state light-emitting element 20 and the semiconductor switch 30a that are placed on the outer face of the capacitor 10e. The capacitor 10e is a capacitor for electric power supply and is a semiconductor capacitor. The capacitor 10e has the same structure as that of the capacitor 10c illustrated in FIGS. 9A and 9B with the exception that via conductors 16b and 17b are provided at a position corresponding to the rear face of the solid-state light-emitting element 20 and the semiconductor switch 30a in the capacitor 10e, as illustrated in FIG. 11B. In order to ensure insulation between the N+ layer 15a serving as the second inner electrode of the capacitor 10e and the silicon substrate 18, an insulating film 16d is formed around the via conductor 16b. In order to ensure insulation between the silicon substrate 18 and the capacitor 10e, an insulating film 17d is formed around the via conductor 17b. In FIG. 11B, the insulating films 16d and 17d are formed so that the two electrodes of the capacitor 10e can be insulated from each other. However, the two electrodes of the capacitor can be insulated from each other by forming an N+ layer or a P+ layer around the via conductors 16b and 17b according to the circuit configuration formed, component arrangement, and configuration of the semiconductor capacitor.

In the light-emitting device 100h, to further increase heat dissipation, the via conductors 16b and 17b are provided. The via conductors 16b and 17b are provided from the outer electrodes 11a and 12a connected to the heat generation source, such as the solid-state light-emitting element 20 and the semiconductor switch 30a toward the rear face of the silicon substrate 18. That is, the via conductors 16b and 17b are third via conductors that are connected to the via conductor 16a (first via conductor) that is electrically connected to the outer electrode 11a and the via conductor 17a (second via conductor) that is electrically connected to the outer electrode 12a.

The via conductors 16b and 17b are formed to reach the face (rear face of the silicon substrate 18) opposite the outer face of the semiconductor capacitor on which the solid-state light-emitting element 20 and the semiconductor switch 30a are placed, and are made of a material with a thermal conductivity higher than that of the silicon substrate 18. Thus, the light-emitting device 100h can easily release heat of the solid-state light-emitting element 20 and the semiconductor switch 30a through the via conductors 16b and 17b, compared to the case where only the silicon substrate 18 is provided. The light-emitting device 100h includes outer electrodes 16c and 17c that are electrically connected to the via conductors 16b and 17b on the rear face of the silicon substrate 18, and therefore, connection to the outer electrodes 11a and 12a can be achieved from the rear face side of the silicon substrate 18.

As described above, in the light-emitting device 100h according to the seventh embodiment, the via conductors 16a and 17a are electrically connected to the via conductors 16b and 17b, respectively, that reach the face (rear face of the silicon substrate 18) opposite the outer face of the semiconductor capacitor on which the solid-state light-emitting element 20 and the semiconductor switch 30a are placed. Thus, in the light-emitting device 100h, thermal conduction from the solid-state light-emitting element 20 and the semiconductor switch 30a to the via conductors 16b and 17b can be achieved, and heat of the solid-state light-emitting element 20 and the semiconductor switch 30a can be easily released.

It is desirable that the via conductors 16b and 17b are made of a material with a thermal conductivity higher than that of silicon.

(Other Modifications)

(1) As explained above, the capacitor 10b according to the fifth embodiment is a semiconductor capacitor having a recessed and projected shape. However, the capacitor is not necessarily a semiconductor capacitor having a recessed and projected shape. The semiconductor capacitor may be configured such that inner electrodes and a dielectric layer sandwiched between the inner electrodes may be parallel plates.

Figure 12A:
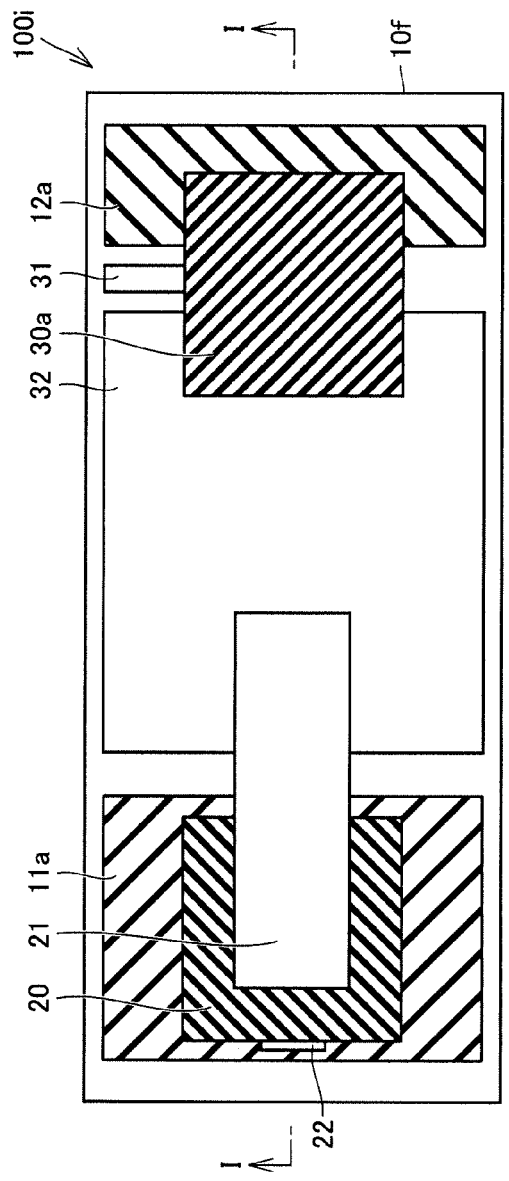
FIGS. 12A and 12B include schematic diagrams for explaining a configuration of a light-emitting device according to modification (1) of the present disclosure.
Figure 12B:
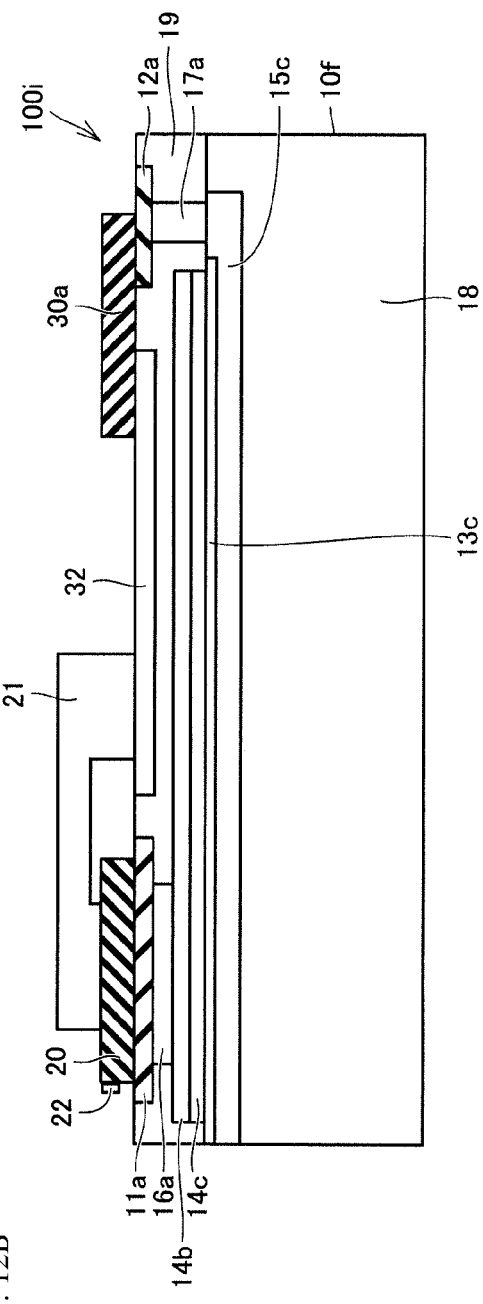

FIGS. 12A and 12B include schematic diagrams for explaining a configuration of a light-emitting device according to modification (1) of the present disclosure. FIG. 12A is a plan view of a light-emitting device 100i when viewed from the outer face of a capacitor 10f on which the solid-state light-emitting element 20 is placed, and FIG. 12B is a cross-section view of the light-emitting device 100i taken along plane I-I. The same features of the configuration of the light-emitting device 100i illustrated in FIGS. 12A and 12B as those of the configurations of the light-emitting device 100 illustrated in FIGS. 1A and 1B, the light-emitting device 100a illustrated in FIGS. 3A, 3B, and 3C, and the light-emitting device 100e illustrated in FIGS. 8A and 8B will be referred to with the same signs as those of the configurations of the light-emitting device 100, the light-emitting device 100a, and the light-emitting device 100e, and detailed explanation for those same features will not be repeated.

The light-emitting device 100i illustrated in FIGS. 12A and 12B include the capacitor 10f, and the solid-state light-emitting element 20 and the semiconductor switch 30a that are placed on the outer face of the capacitor 10f. The capacitor 10f is a capacitor for electric power supply and is a semiconductor capacitor. The capacitor 10f includes an N+ layer 15c that is formed by a semiconductor process and formed by injecting n-type impurity ion at high concentration into the silicon substrate 18, a dielectric layer 13c of a plate shape that is formed on the surface of the N+ layer 15c by the CVD method, and a polysilicon layer 14c of a plate shape that is formed on the surface of the dielectric layer 13c by the CVD method. The example of the capacitor 10f in which the N+ layer 15a is formed by injecting n-type impurity ion into the silicon substrate 18 has been explained above. However, a P+ layer may be formed by injecting p-type impurity ion into the silicon substrate 18 according to the circuit configuration or manufacturing.

Furthermore, the configuration of the capacitor 10f is merely an example, and the above-mentioned configuration is not necessarily adopted. Each of the number of N+ layers 15c, the number of dielectric layers 13c, and the number of polysilicon layers 14c is not necessarily one. A plurality of N+ layers 15c, a plurality of dielectric layers 13c, and a plurality of polysilicon layers 14c may be laminated.

(2) As explained above, in the light-emitting device 100 according to the first embodiment, the connecting electrode 32 that is connected to one electrode of the semiconductor switch 30 is formed on the outer face of the capacitor 10 as a conductive part that allows the solid-state light-emitting element 20 and the semiconductor switch 30 to be connected in series. However, this configuration is not necessarily provided. The connecting electrode 32 may not be provided.

Figure 13A:
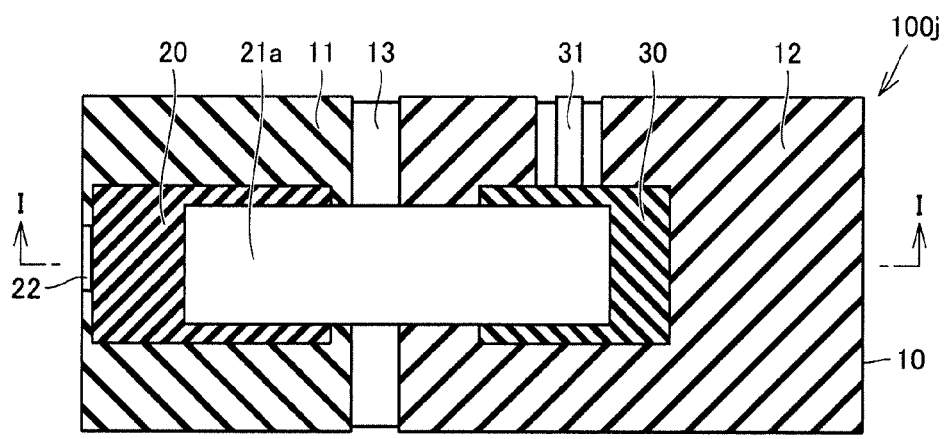
FIGS. 13A and 13B include schematic diagrams for explaining a configuration of a light-emitting device according to modification (2) of the present disclosure.
Figure 13B:
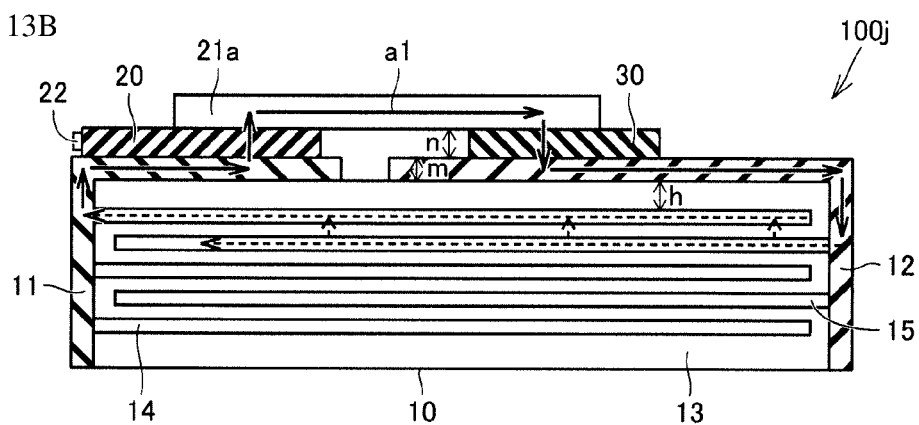

FIGS. 13A and 13B include schematic diagrams for explaining a configuration of a light-emitting device according to modification (2) of the present disclosure. FIG. 13A is a plan view of a light-emitting device 100j when viewed from the outer face of the capacitor 10 on which the solid-state light-emitting element 20 is placed, and FIG. 13B is a cross-section view of the light-emitting device 100j taken along plane I-I. The same features of the configuration of the light-emitting device 100j illustrated in FIGS. 13A and 13B as those of the configuration of the light-emitting device 100 illustrated in FIGS. 1A and 1B will be referred to with the same signs as those of the configuration of the light-emitting device 100, and detailed explanation for those same features will not be repeated.

The light-emitting device 100*j* illustrated in FIGS. 13A and 13B include the capacitor 10, and the solid-state light-emitting element 20 and the semiconductor switch 30 that are placed on the outer face of the capacitor 10. The outer electrodes 11 and 12 are formed on the outer face of the capacitor 10 on which the solid-state light-emitting element 20 and the semiconductor switch 30 are placed. Specifically, in the capacitor 10 illustrated in FIGS. 13A and 13B, the outer electrode 11 is formed on the outer face of the capacitor 10 on the left side on the drawing, and the outer electrode 12 is formed on the outer face of the capacitor 10 on the right side on the drawing.

One electrode (for example, an anode) of the solid-state light-emitting element 20 is connected to the outer electrode 11, and another electrode (for example, a cathode) of the solid-state light-emitting element 20 is electrically connected to wiring 21*a*. For example, silicon MOSFET or GaNFET is used as the semiconductor switch 30. One electrode (for example, a drain electrode) of the semiconductor switch 30 is connected to the wiring 21*a*, and another electrode (for example, a source electrode) of the semiconductor switch 30 is electrically connected to the outer electrode 12. The gate electrode of the semiconductor switch 30 is electrically connected to the gate extended electrode 31 formed on the outer face of the capacitor 10.

The wiring 21*a* is an element connecting electrode that is formed of a single metal plate allowing the solid-state light-emitting element 20 and the semiconductor switch 30 to be connected in series. The wiring 21*a* is a conductive part that allows the solid-state light-emitting element 20 and the semiconductor switch 30 to be connected in series. In the case where the solid-state light-emitting element 20 and the semiconductor switch 30 have the same thickness, the wiring 21*a* that allows connection between the solid-state light-emitting element 20 and the semiconductor switch 30 has a flat metal plate shape, as illustrated in FIG. 13B. With the wiring 21*a* allowing the solid-state light-emitting element 20 and the semiconductor switch 30 to be connected in series, a current loop a1 that goes through the capacitor 10, the solid-state light-emitting element 20, and the semiconductor switch 30 can be shortened, as with the current loop a illustrated in FIG. 1B.

In the current loop a1, the direction (solid-line arrows) in which current flows in the wiring 21*a* and the direction (broken-line arrows) in which current flows in the inner electrodes 14 and 15 are opposite to each other. The direction (solid-line arrows) in which current flows in the wiring 21*a* and the direction (broken-line arrows) in which current flows in the inner electrodes 14 and 15 are opposite to each other with a distance obtained by adding the distance h of the exterior thickness of the capacitor 10, the thickness m of an outer electrode, and the thickness n of the solid-state light-emitting element 20 or the semiconductor switch 30. The thickness of the outer electrode is about several 10 μm, and the thickness of the solid-state light-emitting element 20 or the semiconductor switch 30 is 200 μm or less. Thus, the distance between the direction (solid-line arrows) in which current flows in the wiring 21*a* and the direction (broken-line arrows) in which current flows in the inner electrodes 14 and 15 may be shortened compared to a case where known wiring connection is performed, and the parasitic inductance of the current loop a1 can thus be reduced.

(3) As explained above in the modification (2), the wiring 21*a* has a flat metal plate shape. However, this configuration is not necessarily provided. The wiring 21*a* may have a shape other than the flat metal plate shape.

Figure 14A:
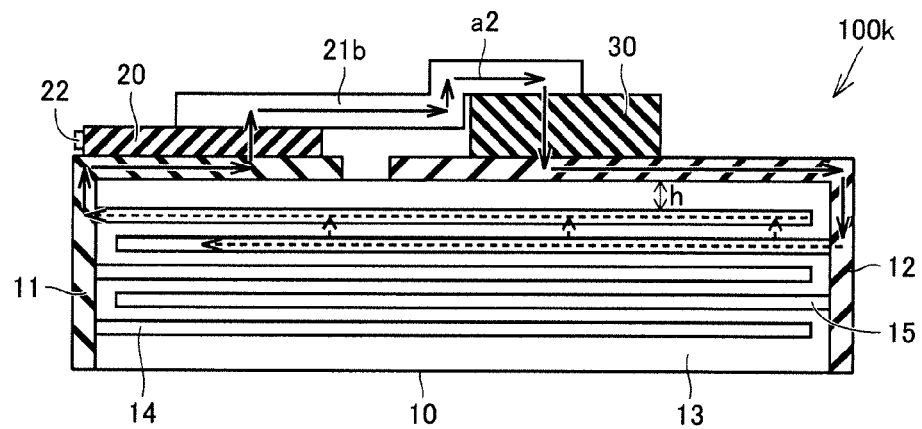
FIGS. 14A and 14B include schematic diagrams for explaining a configuration of a light-emitting device according to modification (3) of the present disclosure.
Figure 14B:
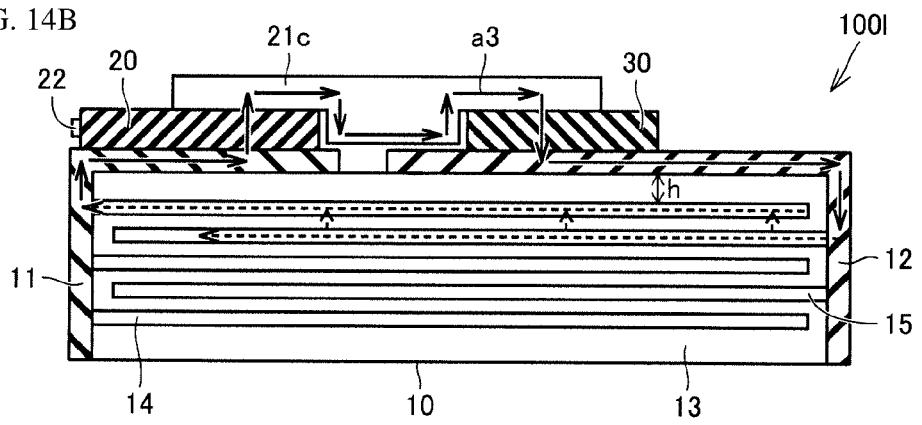

FIGS. 14A and 14B include schematic diagrams for explaining a configuration of a light-emitting device according to modification (3) of the present disclosure. FIG. 14A is a cross-section view of a light-emitting device 100*k* taken along plane I-I, and FIG. 14B is a cross-section view of a light-emitting device 100*l* taken along plane I-I. The plan views of the light-emitting device 100*k* and the light-emitting device 100*l* are the same as the plan view of the light-emitting device 100*j* illustrated in FIG. 13A. The same features of the configurations of the light-emitting devices 100*k* and 100*l* illustrated in FIGS. 14A and 14B as those of the configurations of the light-emitting device 100 illustrated in FIGS. 1A and 1B and the light-emitting device 100*j* illustrated in FIGS. 13A and 13B will be referred to with the same signs as those of the configurations of the light-emitting device 100 and the light-emitting device 100*j*, and detailed explanation for those same features will not be repeated.

Wiring 21*b* illustrated in FIG. 14B is an element connecting electrode that is formed of a single metal plate allowing the solid-state light-emitting element 20 and the semiconductor switch 30 to be connected in series. In the case where the thickness of the semiconductor switch 30 is more than the thickness of the solid-state light-emitting element 20, as illustrated in FIG. 14A, the cross-section shape of the wiring 21*b*, which allows connection between the solid-state light-emitting element 20 and the semiconductor switch 30, is a key shape or a step shape. With the wiring 21*b* allowing the solid-state light-emitting element 20 and the semiconductor switch 30 to be connected in series, a current loop a2 that goes through the capacitor 10, the solid-state light-emitting element 20, and the semiconductor switch 30 can be shortened, as with the current loop a illustrated in FIG. 1B.

A part of the wiring 21*b* connecting a part that is connected to the solid-state light-emitting element 20 and is horizontal to the outer face of capacitor 10 with a part that is connected to the semiconductor switch 30 and is horizontal to the outer face of the capacitor 10 is not necessarily vertical to the outer face of the capacitor 10.

Wiring 21*c* illustrated in FIG. 14B is an element connecting electrode that is formed of a single metal plate allowing the solid-state light-emitting element 20 and the semiconductor switch 30 to be connected in series. Even in the case where the solid-state light-emitting element 20 and the semiconductor switch 30 have the same thickness, as illustrated in FIG. 14B, the wiring 21*c* that allows connection between the solid-state light-emitting element 20 and the semiconductor switch 30 does not have a flat metal plate shape but has a T-shape cross-section. With the wiring 21*c* allowing the solid-state light-emitting element 20 and the semiconductor switch 30 to be connected in series, a current loop a3 that goes through the capacitor 10, the solid-state light-emitting element 20, and the semiconductor switch 30 can be shortened, compared to the current loop a illustrated in FIG. 1B for the case where the connecting electrode 32 is provided.

The cross-section shape of the wiring 21*c* is not limited to a T-shape. The wiring 21*c* may have any shape as long as the wiring 21*c* can fill the space between the solid-state light-emitting element 20 and the semiconductor switch 30, as illustrated in FIG. 14B. Current flowing in the wiring 21*c* between the solid-state light-emitting element 20 and the semiconductor switch 30 can be approximate to current flowing in the inner electrodes 14 and 15, compared to current flowing in a corresponding position in FIG. 13B and FIG. 14A. Thus, the parasitic inductance of the current loop a3 can be reduced compared to the parasitic inductance of the current loops a1 and a2.

(4) As explained above, in the light-emitting device 100e according to the fifth embodiment, the solid-state light-emitting element 20 and the semiconductor switch 30a are placed on the outer face of the capacitor 10b. However, this configuration is not necessarily provided. In the case where a semiconductor capacitor is used as the capacitor, the semiconductor switch 30a may be integrated with the semiconductor capacitor.

Figure 15A:
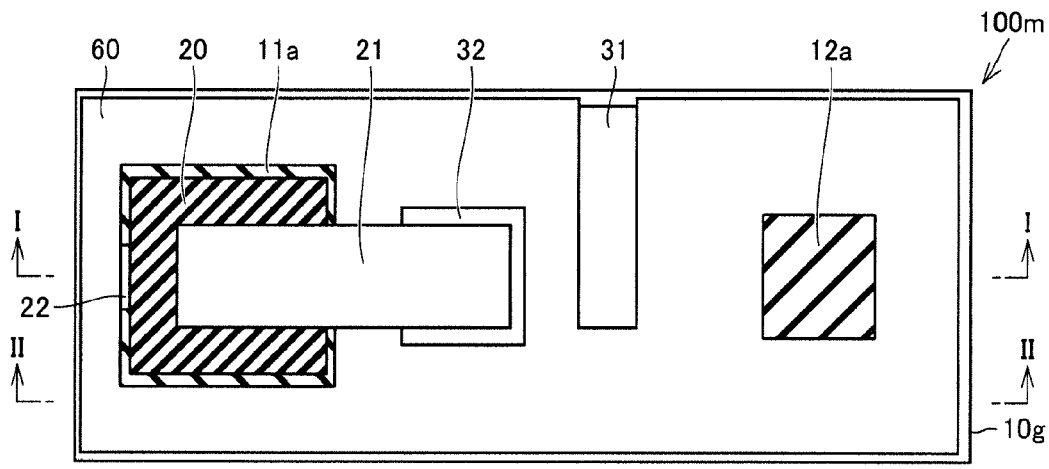
FIGS. 15A, 15B, and 15C include schematic diagrams for explaining a configuration of a light-emitting device according to modification (4) of the present disclosure.
Figure 15B:
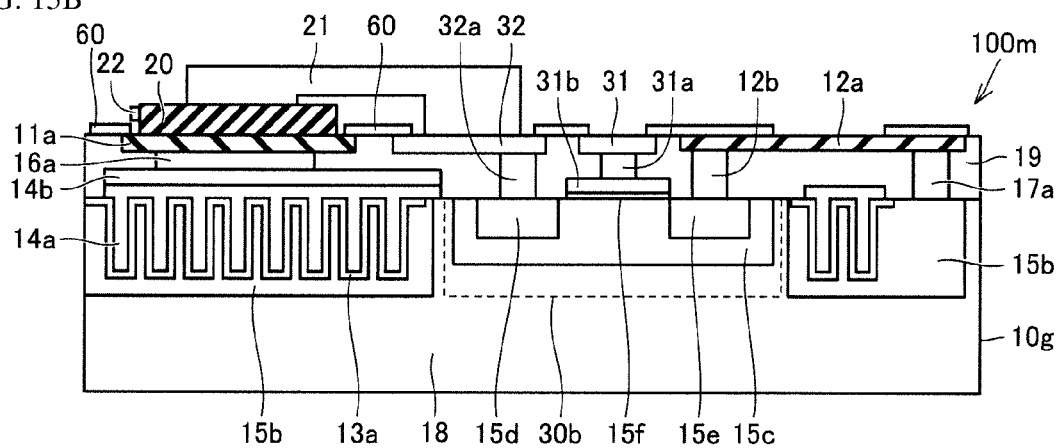
Figure 15C:
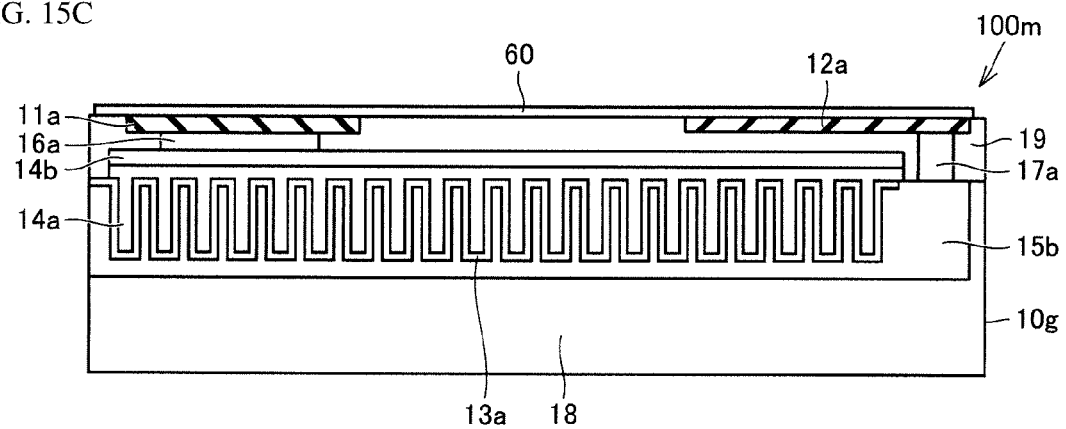

FIGS. 15A, 15B, and 15C include schematic diagrams for explaining a configuration of a light-emitting device according to modification (4) of the present disclosure. FIG. 15A is a plan view of a light-emitting device 100m when viewed from the outer face of a capacitor 10g on which the solid-state light-emitting element 20 is placed, FIG. 15B is a cross-section view of the light-emitting device 100m taken along plane I-I, and FIG. 15C is a cross-section view of the light-emitting device 100m taken along plane II-II. The same features of the configuration of the light-emitting device 100m illustrated in FIGS. 15A, 15B, and 15C as those of the configurations of the light-emitting device 100 illustrated in FIGS. 1A and 1B, the light-emitting device 100a illustrated in FIGS. 3A, 3B, and 3C, and the light-emitting device 100e illustrated in FIGS. 8A and 8B will be referred to with the same signs as those of the configurations of the light-emitting device 100, the light-emitting device 100a, and the light-emitting device 100e, and detailed explanation for those same features will not be repeated.

The light-emitting device 100m illustrated in FIGS. 15A, 15B, and 15C include the capacitor 10g and the solid-state light-emitting element 20 placed on the outer face of the capacitor 10g. The capacitor 10g has a configuration in which, as illustrated in FIG. 15C, a plurality of trenches or a plurality of pillars are formed at the silicon substrate 18 to have a recessed and projected shape, the low-resistivity P+ layer 15b is formed by injecting p-type impurity ion at high concentration into the formed recessed and projected shape, and the dielectric layer 13a is formed to be sandwiched by the polysilicon layer 14a.

Furthermore, not only the capacitor 10g but also a semiconductor switch 30b is formed on the silicon substrate 18, as illustrated in FIG. 15B. The semiconductor switch 30b includes a P+ layer 15c formed by injecting p-type impurity ion at high concentration into the silicon substrate 18 and an N+ layer 15d serving as a drain electrode and an N+ layer 15e serving as a source electrode that are formed by injecting n-type impurity ion at high concentration into the P+ layer 15c. Furthermore, in the semiconductor switch 30b, a gate oxide film 15f is formed between the N+ layer 15d and the N+ layer 15e, and a metal film 31b, a via conductor 31a, and the gate extended electrode 31 are formed on the gate oxide film 15f. The example of the capacitor 10g in which the P+ layer 15b and the P+ layer 15c are formed at the silicon substrate 18 and the N+ layer 15d serving as the drain electrode and the N+ layer 15e serving as the source electrode are formed at the P+ layer 15c is explained above. However, a P+ layer and an N+ layer to be formed may be exchanged according to the circuit configuration or manufacturing.

That is, the semiconductor switch 30b is not placed on the capacitor 10g but is provided inside the silicon substrate 18 that forms a semiconductor capacitor as the capacitor 10g. As illustrated in FIGS. 8A and 8B, in the case where the semiconductor switch 30a is placed on the outer face of a capacitor b, current flowing in the semiconductor switch 30a flows on the outer face of the silicon substrate 18. However, in the case where the semiconductor switch 30b is integrated with the silicon substrate 18 as illustrated in FIG. 15B, current flowing in the semiconductor switch 30b flows inside the silicon substrate 18. Thus, the current loop that goes through the capacitor 10g, the solid-state light-emitting element 20, and the semiconductor switch 30b can be shortened, and the parasitic inductance of the current loop can thus be reduced.

As illustrated in FIG. 15A, in the light-emitting device 100m, a component, such as a semiconductor switch is not necessarily mounted on the outer face of the capacitor 10g. However, for example, there is a need to acquire GND voltage from outside, as in the circuit diagram illustrated in FIG. 2. Thus, part of a passivation layer 60 in which the outer electrode 12a is provided has a cavity.

(5) As explained above, in the light-emitting device 100e according to the fifth embodiment, wiring for placing the solid-state light-emitting element 20 and the semiconductor switch 30 on the insulating film 19 made of an inorganic material, such as silicon oxide or silicon nitride is formed on the outer face of the capacitor 10b. However, this configuration is not necessarily provided. Wiring for placing the solid-state light-emitting element 20 and the semiconductor switch 30 may be formed by a re-wiring process.

Figure 16A:
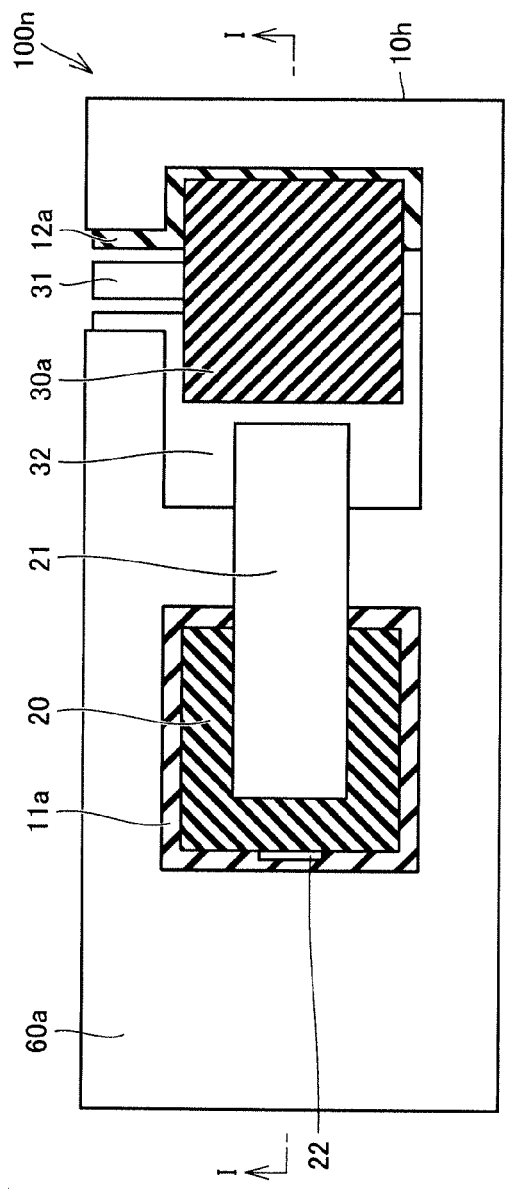
FIGS. 16A and 16B include schematic diagrams for explaining a configuration of a light-emitting device according to modification (5) of the present disclosure.
Figure 16B:
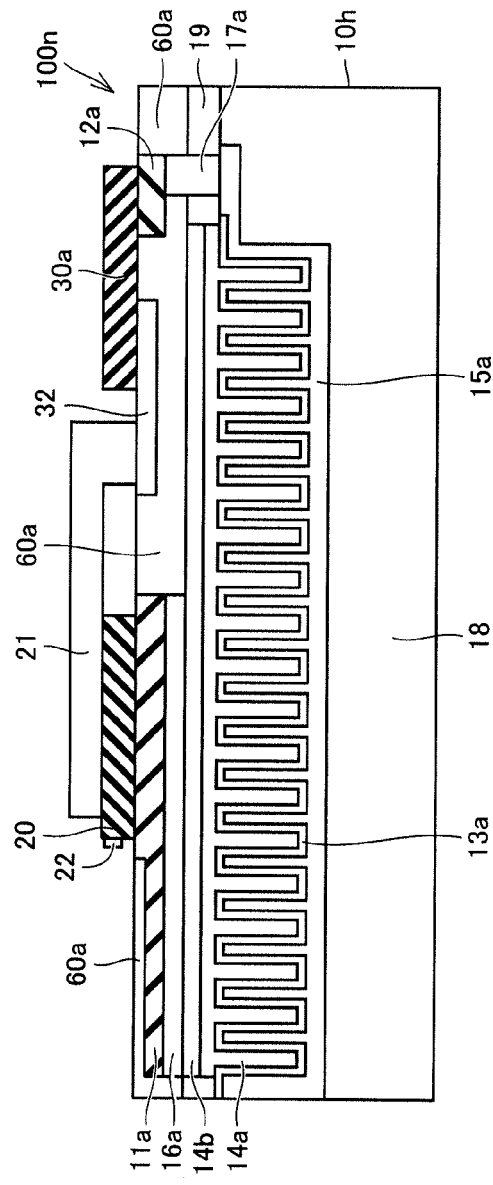

FIGS. 16A and 16B include schematic diagrams for explaining a configuration of a light-emitting device according to modification (5) of the present disclosure. FIG. 16A is a plan view of a light-emitting device 100n when viewed from the outer face of a capacitor 10h on which the solid-state light-emitting element 20 is placed, and FIG. 16B is a cross-section view of the light-emitting device 100n taken along plane I-I. The same features of the configuration of the light-emitting device 100n illustrated in FIGS. 16A and 16B as those of the configurations of the light-emitting device 100 illustrated in FIGS. 1A and 1B, the light-emitting device 100a illustrated in FIGS. 3A, 3B, and 3C, and the light-emitting device 100e illustrated in FIGS. 8A and 8B will be referred to with the same signs as those of the configurations of the light-emitting device 100, the light-emitting device 100a, and the light-emitting device 100e, and detailed explanation for those same features will not be repeated.

The light-emitting device 100n illustrated in FIGS. 16A and 16B include the capacitor 10h, and the solid-state light-emitting element 20 and the semiconductor switch 30a that are placed on the outer face of the capacitor 10h. The insulating film 19 made of an inorganic material, such as silicon oxide or silicon nitride are formed on the outer face of the capacitor 10h, and an insulating film 60a made of an organic material, such as polyimide or a resin is formed on the insulating film 19 in a combined manner. Thus, in the capacitor 10h, a wiring layer and the like for placing the solid-state light-emitting element 20 and the semiconductor switch 30a are not formed in a pre-process of a semiconductor manufacturing. A wiring layer and the like may be formed on the insulating film 60a in a re-wiring process.

(6) As explained above, in a light-emitting device according to an embodiment described above, elements placed on the outer face of the capacitor are the solid-state light-emitting element 20, the semiconductor switch 30 or 30a, and the clamp diode 40. However, this configuration is not necessarily provided. Any element that is able to be mounted on the capacitor may be provided.

(7) As explained above, in a light-emitting device according to an embodiment described above, the solid-state light-emitting element 20 and the semiconductor switch 30 or 30a are placed on the outer face of the same capacitor. However, this configuration is not necessarily provided. A face on which the solid-state light-emitting element 20 is placed and a face on which the semiconductor switch 30 or 30a is placed may be different.

(8) As explained above, in an embodiment described above, a single solid-state light-emitting element 20 is placed on the outer face of a capacitor. However, this configuration is not necessarily provided. A plurality of solid-state light-emitting elements may be placed on the outer face of a capacitor.

(9) As explained above, in a light-emitting device according to an embodiment described above, the solid-state light-emitting element 20 includes the light-emitting unit 22 that emits light in a direction parallel to the outer face of the capacitor. However, this configuration is not necessarily provided. The solid-state light-emitting element 20 may include the light-emitting unit 22 that emits light in a direction vertical to the outer face of the capacitor.

(10) As explained above, in a light-emitting device according to an embodiment described above, a solid-state light-emitting element is placed on the outer face of a capacitor and a semiconductor switch is provided on the outer face of or inside the capacitor. However, such a light-emitting device usually needs a driving element (gate driver element) for driving the semiconductor switch. In modification (10) of the present disclosure, a configuration in which a driving element for driving the semiconductor switch, as well as the solid-state light-emitting element and the semiconductor switch, is placed on the outer face of the capacitor will be described.

Figure 17:
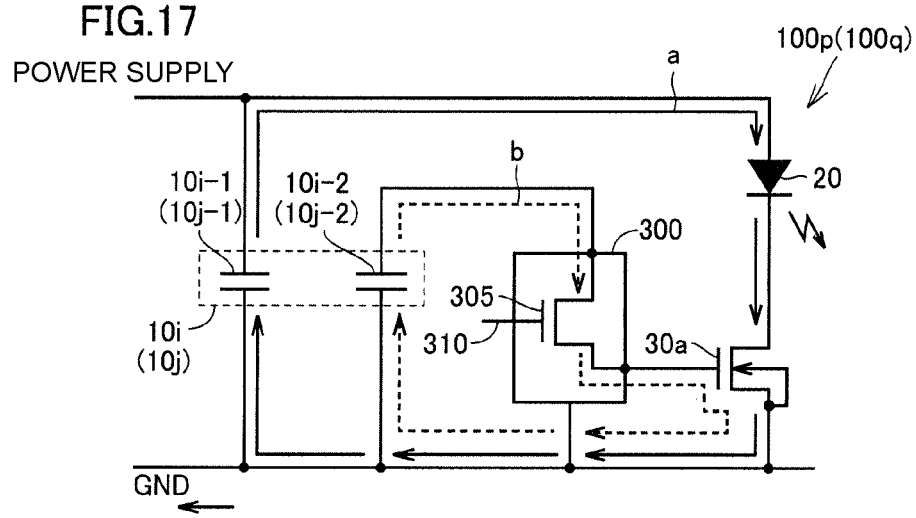
FIG. 17 is a circuit diagram of a light-emitting device including a driving element that drives a semiconductor switch.

FIG. 17 is a circuit diagram of a light-emitting device 100p that includes a driving element 300 that drives the semiconductor switch 30a. In the light-emitting device 100p illustrated in FIG. 17, the driving element 300 and a capacitor 10i-2 for supplying electric power to the driving element 300 are added to the configuration of the light-emitting device 100 illustrated in FIG. 2. The same features of the configuration of the light-emitting device 100p illustrated in FIG. 17 as those of the configuration of the light-emitting device 100 illustrated in FIG. 2 will be referred to with the same signs as those of the configuration of the light-emitting device 100, and detailed explanation for those same features will not be repeated.

In the circuit diagram illustrated in FIG. 17, one electrode of a capacitor 10i-1 corresponding to the capacitor 10 illustrated in FIG. 2 is connected to one electrode (for example, an anode) of the solid-state light-emitting element 20, and another electrode (for example, a cathode) of the solid-state light-emitting element 20 is connected to the semiconductor switch 30a. One electrode (for example, a drain electrode) of the semiconductor switch 30a is connected to the solid-state light-emitting element 20, and another electrode (for example, a source electrode) of the semiconductor switch 30a is connected to another electrode of the capacitor 10i-1 and GND wiring.

One electrode of the capacitor 10i-2 is connected to the GND wiring, and another electrode of the capacitor 10i-2 is connected to the driving element 300. The driving element 300 includes a semiconductor switch 305 made of, for example, MOSFET or GaNFET. One electrode (for example, a drain electrode) of the driving element 300 is electrically connected to the capacitor 10i-2, and another electrode (for example, a source electrode) of the driving element 300 is electrically connected to the gate electrode of the semiconductor switch 30a. The semiconductor switch 305 is controlled in accordance with a control signal applied to a control electrode (for example, a gate electrode), and drives the semiconductor switch 30a.

When the semiconductor switch 30a is driven from a non-conduction state to a conduction state, a current loop b (broken-line arrows in FIG. 17) in which current is supplied from the capacitor 10i-2 through the semiconductor switch 305 inside the driving element 300 to the gate electrode of the semiconductor switch 30a for driving the solid-state light-emitting element 20 and then through the parasitic capacitance of the semiconductor switch 30a and the GND wiring and returns to the capacitor 10i-2 is formed. If the parasitic inductance generated in the current loop b is large, current supplied to the gate electrode of the semiconductor switch 30a is restricted. Thus, a long transition time is required for transition from the non-conduction state to the conduction state, and a large current cannot be supplied to the semiconductor switch 30a for a short period of time. In such a case, the rising speed of current in the solid-state light-emitting element 20 is also restricted, and a certain amount of time or more is required to reach a current value suitable for light emission, and light with a short pulse cannot be output easily.

In the modification (10) of the present disclosure, the driving element 300 for the semiconductor switch 30a that drives the solid-state light-emitting element 20 is placed on the outer face of the capacitor for electric power supply to the solid-state light-emitting element 20. Accordingly, compared to the case where the driving element is provided outside, the path length of the current loop b for gate driving can be shortened, and the parasitic inductor can thus be reduced. Furthermore, the capacitor 10i-2 for supplying electric power to the driving element 300 is formed inside the capacitor on which the solid-state light-emitting element 20 and the like are placed. Thus, the path length of the current loop b can further be shortened.

Figure 18A:
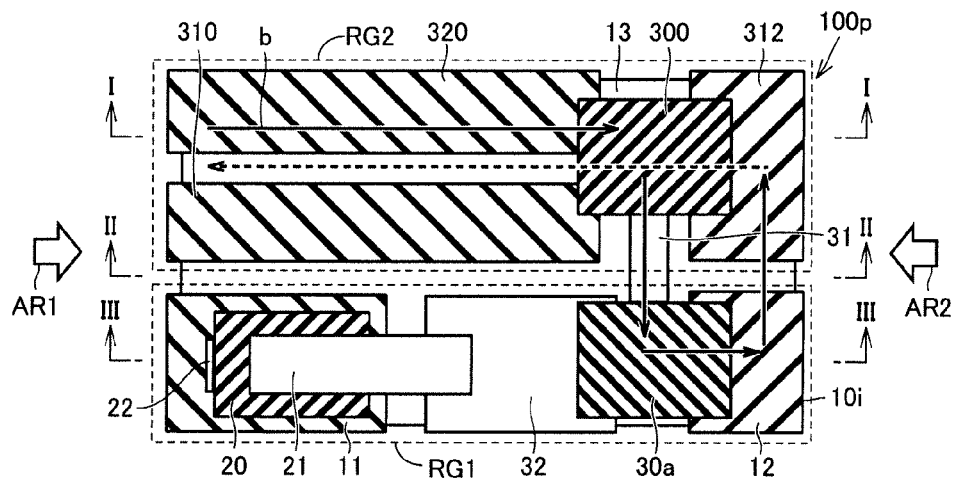
FIGS. 18A, 18B, 18C, and 18D include schematic diagrams for explaining a configuration of a light-emitting device according to modification (10) of the present disclosure.
Figure 18B:
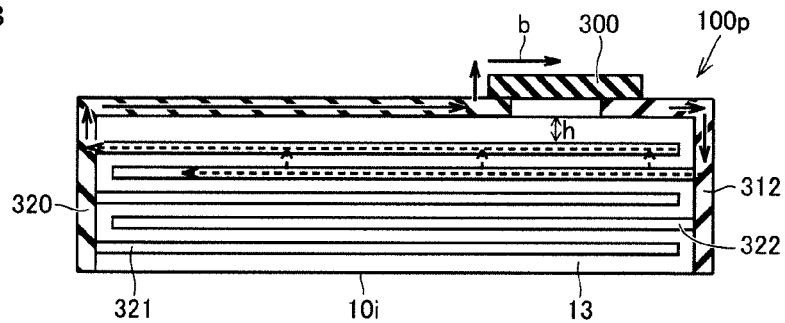
Figure 18C:
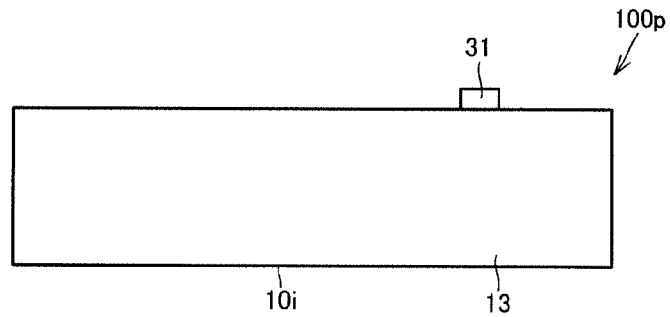
Figure 18D:
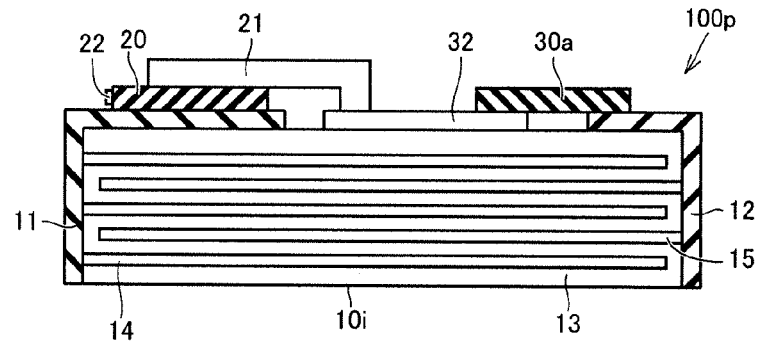
Figure 19A:
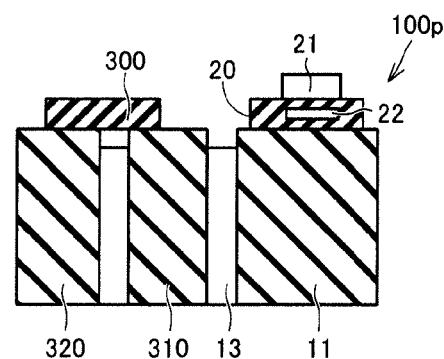
FIGS. 19A and 19B include side views of the light-emitting device according to the modification (10) of the present disclosure.
Figure 19B:
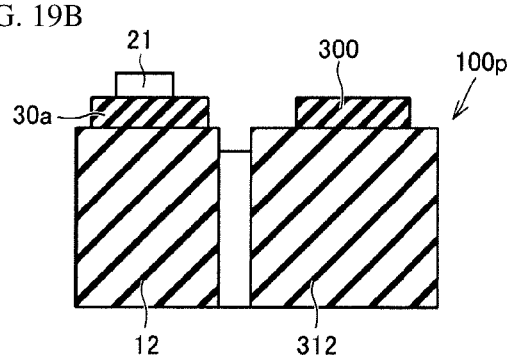

FIGS. 18A, 18B, 18C, and 18D include schematic diagrams for explaining a configuration of the light-emitting device 100p according to the modification (10) of the present disclosure. FIG. 18A is a plan view of the light-emitting device 100p when viewed from the outer face of a capacitor 10i on which the solid-state light-emitting element 20 is placed, FIG. 18B is a cross-section view of the light-emitting device 100p taken along plane I-I, FIG. 18C is a cross-section view of the light-emitting device 100p taken along plane II-II, and FIG. 18D is a cross-section view of the light-emitting device 100p taken along plane III-III. FIGS. 19A and 19B include side views of the light-emitting device 100p. FIG. 19A is a side view when viewed from a direction of an arrow AR1 in FIG. 18A, and FIG. 19B is a side view when viewed from a direction of an arrow AR2 in FIG. 18A. The same features of the light-emitting device 100p illustrated in FIGS. 18A, 18B, 18C, and 18D and FIGS. 19A and 19B as those of the configuration of the light-emitting device 100 illustrated in FIGS. 1A and 1B will be referred to with the same signs as those of the configuration of the light-emitting device 100, and detailed explanation for those same features will not be repeated.

The light-emitting device 100p illustrated in FIGS. 18A, 18B, 18C, and 18D and FIGS. 19A and 19B include the capacitor 10i, and the solid-state light-emitting element 20, the semiconductor switch 30a, and the driving element 300 that are placed on the outer face of the capacitor 10i. The driving element 300 is electrically connected, on the outer face of the capacitor 10i, to an outer electrode 320 for electric power supply, an outer electrode 310 for a control signal, and an outer electrode 312 connected to GND wiring. The driving element 300 is electrically connected to the semiconductor switch 30a with the gate extended electrode 31 interposed therebetween. The outer electrodes 310, 312, and 320 are also formed over the side face of the capacitor 10i, as illustrated in FIGS. 19A and 19B.

The capacitor 10i is a capacitor for electric power supply and is a multilayer ceramic capacitor. As explained with reference to FIG. 17, in the light-emitting device 100p illustrated in FIGS. 18A, 18B, 18C, and 18D, the capacitor 10i-1 for supplying electric power to the solid-state light-emitting element 20 and the capacitor 10i-2 for supplying electric power to the driving element 300 are formed. The capacitor 10i-1 is formed in a region RG1 in FIG. 18A, and is a multilayer body in which the plurality of inner electrodes 14 and 15 for acquiring electrostatic capacitance and the dielectric ceramic layer 13 are laminated in an alternate manner, as illustrated in FIG. 18D.

In contrast, the capacitor 10i-2 is formed in a region RG2 in FIG. 18A, and is a multilayer body in which a plurality of inner electrodes 321 and 322 for acquiring electrostatic capacitance and the dielectric ceramic layer 13 are laminated in an alternate manner, as illustrated in FIG. 18B. That is, the capacitor 10i-2 is a multilayer body in which the inner electrodes 321 (third inner electrodes) and the inner electrodes 322 (fourth inner electrodes) are laminated in an alternate manner to sandwich the dielectric ceramic layer 13 therebetween. The inner electrodes 321 are extended to an end portion on the outer electrode 11 side and are electrically connected to the outer electrode 320 (third outer electrode) provided on the end portion. The inner electrodes 322 are extended to an end portion opposite the end portion for the inner electrodes 321 and are electrically connected to the outer electrode 312 (fourth outer electrode) connected to the GND wiring.

As illustrated in FIG. 18C, in an area between the region RG1 in which the capacitor 10i-1 is formed and the region RG2 in which the capacitor 10i-2 is formed, there is a region in which no inner electrode is arranged and only the dielectric ceramic layer 13 is arranged. That is, the inner electrodes 14 and 15 are not directly connected to the inner electrodes 321 and 322. In other words, in the light-emitting device 100p illustrated in FIGS. 18A, 18B, 18C, and 18D, the inner electrodes 15 (second inner electrodes) and the inner electrodes 322 (fourth inner electrodes) corresponding to electrodes on a negative side of the capacitor are insulated from each other, and the inner electrodes 14 (first inner electrodes) and the inner electrodes 321 (third inner electrodes) corresponding to electrodes on a positive side of the capacitor are insulated from each other. Although not illustrated in FIGS. 18 and 19, the outer electrode 12 and the outer electrode 312 are connected to the common GND wiring outside the light-emitting device 100p. Furthermore, in the light-emitting device 100p, the inner electrodes 15 and the inner electrodes 322 may be directly connected to each other or the outer electrode 12 and the outer electrode 312 may be directly connected to each other.

In the light-emitting device 100p illustrated in FIGS. 18A, 18B, 18C, and 18D, the current loop b passing through the driving element 300 has a path going through the inner electrodes 321, the outer electrode 320, the driving element 300, the gate extended electrode 31, the semiconductor switch 30a, the outer electrode 12, the outer electrode 312, and the inner electrodes 322 of the capacitor 10i-2, as illustrated in FIGS. 18A and 18B. That is, the current loop b is formed inside the substrate at which the light-emitting device 100p is formed. Thus, compared to the case where the driving element 300 is provided outside the substrate, the current loop b can be shortened. Furthermore, regarding the direction of flow of the current loop b, as illustrated in FIG. 18B, the direction of current flowing in the outer electrode 320 and the driving element 300 and the direction of current flowing in the inner electrodes 321 and 322 are opposite to each other with the distance h of the exterior thickness of the capacitor 10i. Accordingly, the effect that magnetic fluxes generated by current cancel each other out (effect of offset) increases, and the parasitic inductance of the current loop b can be reduced.

As described above, in the light-emitting device 100p, not only the parasitic inductance of the current loop a for driving current for the solid-state light-emitting element 20 but also the parasitic inductance of the current loop b for current flowing in the driving element 300 is reduced. Accordingly, the pulse width of current can be reduced, and light with a short pulse can thus be output from the solid-state light-emitting element 20.

As described above, the light-emitting device 100p according to the modification (10) of the present disclosure includes the driving element 300 placed on the outer face of the capacitor 10i so that the semiconductor switch 30a (switching element) can be driven. Furthermore, the capacitor 10i includes the inner electrodes 321 (third inner electrodes) and the inner electrodes 322 (fourth inner electrodes) that are provided with the dielectric ceramic layer 13 sandwiched therebetween, the outer electrode 320 (third outer electrode) that is electrically connected to the inner electrodes 321, and the outer electrode 312 (fourth outer electrode) that is electrically connected to the inner electrodes 322. The inner electrodes 321 are insulated from the inner electrodes 14 (first inner electrodes), and the outer electrode 312 is electrically connected to the outer electrode 12 (second outer electrode). The driving element 300 is connected between the outer electrode 312 and the outer electrode 320. Therefore, the parasitic inductance of the current loop b for current flowing in the driving element 300 can be reduced, and light with a short pulse can thus be output from the solid-state light-emitting element 20.

The example of the configuration in which the capacitor 10i is a multilayer ceramic capacitor is explained above with reference to FIGS. 18 and 19. However, the configuration of the capacitor is not limited to this. A capacitor of a type different from the multilayer ceramic capacitor may be used.

Figure 20A:
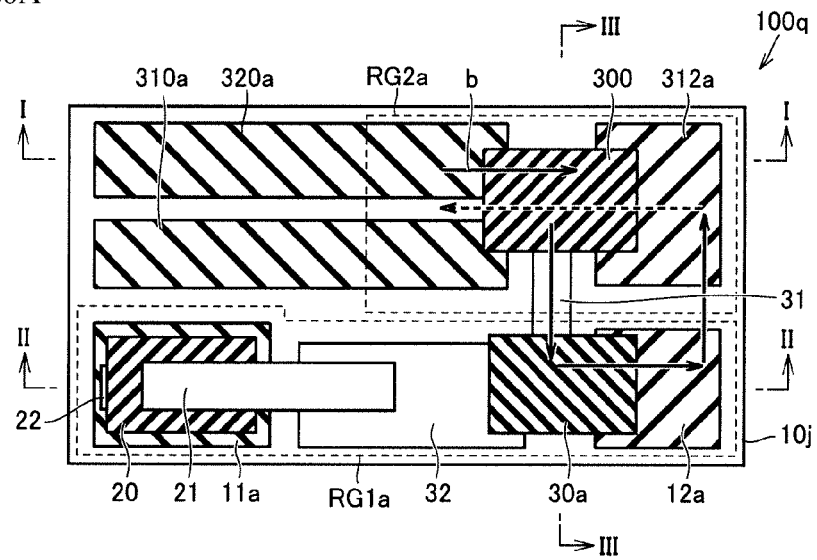
FIGS. 20A, 20B, 20C, and 20D include schematic diagrams for explaining another example of the configuration of the light-emitting device according to the modification (10) of the present disclosure.
Figure 20B:
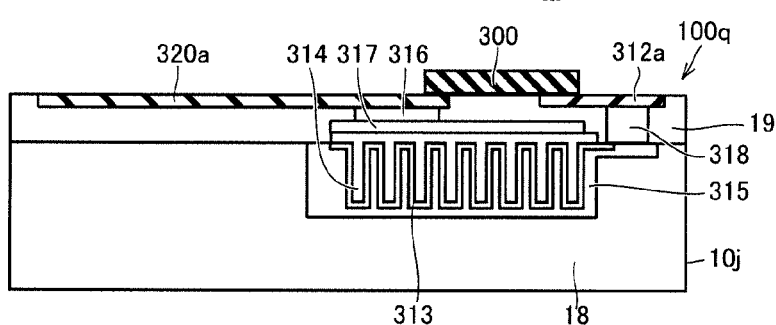
Figure 20C:
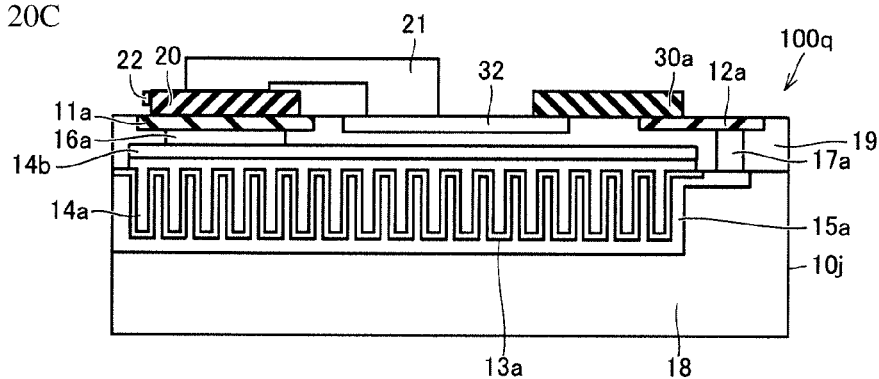
Figure 20D:
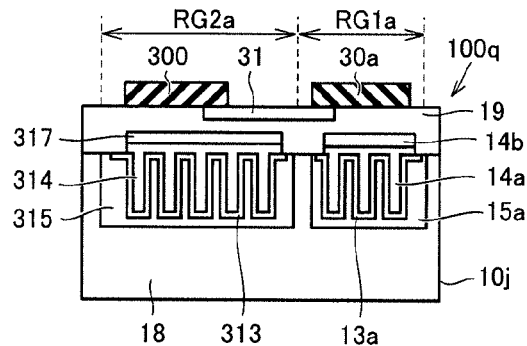

FIGS. 20A, 20B, 20C, and 20D include schematic diagrams for explaining another example of the configuration of the light-emitting device according to the modification (10) of the present disclosure. As in the fifth embodiment, a configuration in which a semiconductor capacitor is used as the capacitor is provided. FIG. 20A is a plan view of a light-emitting device 100q when viewed from the outer face of a capacitor 10j on which the solid-state light-emitting element 20 is placed, FIG. 20B is a cross-section view of the light-emitting device 100q taken along plane I-I, FIG. 20C is a cross-section view of the light-emitting device 100q taken along plane II-II, and FIG. 20D is a cross-section view of the light-emitting device 100q taken along plane III-III. The same features of the configuration of the light-emitting device 100q illustrated in FIGS. 20A, 20B, 20C, and 20D as those of the configuration of the light-emitting device 100e according to the fifth embodiment illustrated in FIGS. 8A and 8B will be referred to with the same signs as those of the configuration of light-emitting device 100e, and detailed explanation for those same features will not be repeated.

The light-emitting device 100q illustrated in FIGS. 20A, 20B, 20C, and 20D include the capacitor 10j, and the solid-state light-emitting element 20, the semiconductor switch 30a, and the driving element 300 that are placed on the outer face of the capacitor 10*j*. The driving element 300 is electrically connected to an outer electrode 320*a* for electric power supply, an outer electrode 310*a* for a control signal, and an outer electrode 312*a* connected to GND wiring on the outer face of the capacitor 10*j*. Furthermore, the driving element 300 is electrically connected to the semiconductor switch 30*a* with the gate extended electrode 31 interposed therebetween.

The capacitor 10*j* is a capacitor for electric power supply and is a semiconductor capacitor. In the light-emitting device 100*q* illustrated in FIGS. 20A, 20B, 20C, and 20D, a capacitor 10*j*-1 for supplying electric power to the solid-state light-emitting element 20 and a capacitor 10*j*-2 for supplying electric power to the driving element 300 are formed. The capacitor 10*j*-1 is formed in a region RG1*a* in FIG. 20A, and the capacitor 10*j*-2 is formed in a region RG2*a* in FIG. 20A.

As explained above with reference to FIGS. 8A and 8B, the capacitor 10*j*-1 is formed by the semiconductor process. The capacitor 10*j*-1 includes the N+ layer 15*a* formed by injecting n-type impurity ion at high concentration into the silicon substrate 18, the dielectric layer 13*a* made of an inorganic material formed on the surface of the N+ layer 15*a* by, for example, the CVD method, and the conductive polysilicon layer 14*a* formed on the surface of the dielectric layer 13*a* by the CVD method (FIG. 20C).

In a similar manner, the capacitor 10*j*-2 is formed by the semiconductor process. The capacitor 10*j*-2 includes an N+ layer 315 formed by injecting n-type impurity ion into the silicon substrate 18, a dielectric layer 313 made of an inorganic material formed on the surface of the N+ layer 315 by the CVD method or the like, and a conductive polysilicon layer 314 formed on the surface of the dielectric layer 313 by the CVD method (FIG. 20B). As explained above, the substrate that forms the capacitor 10*j* is the silicon substrate 18. However, the substrate may be a sapphire substrate, a GaAs substrate, or the like. The capacitor 10*j*-1 and the capacitor 10*j*-2 may be made of p-type impurity ion in place of n-type impurity ion.

The N+ layer 315 of the capacitor 10*j*-2 is a low-resistivity layer formed by injecting n-type impurity ion at high concentration into a surface of the silicon substrate 18 with a recessed and projected shape formed by forming a plurality of trenches or a plurality of pillars into the silicon substrate 18. As described above, by increasing the area of the dielectric layer sandwiched between the N+ layer and the polysilicon layer, the capacitance of the capacitor is increased.

The polysilicon layer 314 is used as one electrode (third inner electrode) that forms the capacitance of the capacitor 10*j*-2. With a metal layer 317 formed above the polysilicon layer 314, the resistivity of the one electrode formed by the polysilicon layer 314 is reduced. If a required resistivity can be obtained only with the polysilicon layer 314, the metal layer 317 is not necessarily formed. In the case where the metal layer 317 is formed above the polysilicon layer 314, the polysilicon layer 314 is electrically connected to the outer electrode 320*a* with a via conductor 316 interposed therebetween. Furthermore, although the one electrode (third inner electrode) that forms the capacitance of the capacitor 10*j*-2 is formed of the polysilicon layer 314, the electrode may be formed of a metal layer or the like. The N+ layer 315 is used as another electrode (fourth inner electrode) that forms the capacitance of the capacitor 10*j*-2. The N+ layer 315 is electrically connected to the outer electrode 312*a* with a via conductor 318 interposed therebetween.

As illustrated in FIG. 20D, in an area between the region RG1*a* in which the capacitor 10*j*-1 is formed and the region RG2*a* in which the capacitor 10*j*-2 is formed, there is a region in which no semiconductor capacitor is formed and only the silicon substrate 18 is formed. That is, the polysilicon layer 14*a* is not directly connected to the polysilicon layer 314, and the N+ layer 15*a* is not directly connected to the N+ layer 315. In other words, in the light-emitting device 100*q* illustrated in FIGS. 20A, 20B, 20C, and 20D, the N+ layer 15*a* and the N+ layer 315 corresponding to electrodes on the negative side of the capacitor are insulated from each other, and the polysilicon layer 14*a* (first inner electrode) and the polysilicon layer 314 (third inner electrode) corresponding to electrodes on the positive side of the capacitor are insulated from each other. Although not illustrated in FIG. 20, the outer electrode 12*a* and the outer electrode 312*a* on the negative side are connected to the common GND wiring outside the light-emitting device 100*q*. Furthermore, in the light-emitting device 100*q*, the N+ layer 15*a* and the N+ layer 315 may be directly connected to each other or the outer electrode 12*a* and the outer electrode 312*a* may be directly connected to each other.

In the light-emitting device 100*q* illustrated in FIGS. 20A, 20B, 20C, and 20D, the current loop b passing through the driving element 300 has a path going through the polysilicon layer 314, the metal layer 317, the via conductor 316, the outer electrode 320*a*, the driving element 300, the gate extended electrode 31, the semiconductor switch 30*a*, the outer electrode 12*a*, the outer electrode 312*a*, the via conductor 318, and the N+ layer 315 of the capacitor 10*j*-2, as illustrated in FIG. 20A. In the light-emitting device 100*q*, after the insulating film 19 made of, for example, silicon oxide or silicon nitride with a thickness of 100 μm or less is formed on the metal layer 14*b* and the metal layer 317, the outer electrodes 11*a*, 12*a*, 310*a*, 312*a*, and 320*a*, the connecting electrode 32, and the via conductors 16*a*, 17*a*, 316, and 318 are formed by the semiconductor process. Thus, in the light-emitting device 100*q*, the distance between the capacitor 10*j*-1 and the outer electrodes 11*a* and 12*a* and the distance between the capacitor 10*j*-2 and the outer electrodes 320*a* and 312*a* can further be shortened by fine processing, and the current loop can further be shortened. Therefore, in the light-emitting device 100*q*, not only the parasitic inductance of the current loop a for driving current for the solid-state light-emitting element 20 but also the parasitic inductance of the current loop b for current flowing in the driving element 300 is reduced. Accordingly, the pulse width of current can be reduced, and light with a short pulse can thus be output from the solid-state light-emitting element 20.

(11) As explained above, in a configuration in the modification (10), one electrodes of capacitors are connected to GND wiring, as illustrated in FIG. 17. Thus, in the modification (10), the inner electrodes 15 and the inner electrodes 322 or the outer electrode 12 and the outer electrode 312 illustrated in FIGS. 18A, 18B, 18C, and 18D and the N+ layer 15*a* and the N+ layer 315 or the outer electrode 12*a* and the outer electrode 312*a* illustrated in FIGS. 19A and 19B may be shared with each other.

However, the circuit configuration of a light-emitting device is not limited to that illustrated in FIG. 17. In modification (11) of the present disclosure, as in the modification (10), in an arrangement in which a solid-state light-emitting element, a semiconductor switch, and a driving element are placed on the outer face of a capacitor, a configuration in which a capacitor for supplying electric power to the solid-state light-emitting element and a capacitor for supplying electric power to the driving element do not share electrodes will be described.

Figure 21:
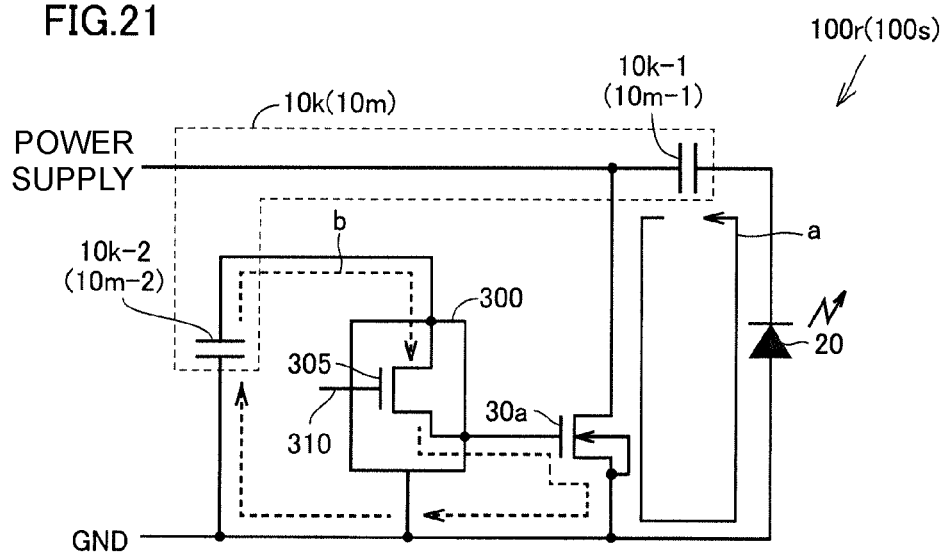
FIG. 21 is a circuit diagram of a light-emitting device according to modification (11) of the present disclosure.

FIG. 21 is a circuit diagram of a light-emitting device 100r according to a modification of the present disclosure. In the light-emitting device 100r illustrated in FIG. 21, one electrode of a capacitor 10k-1 that supplies electric power to the solid-state light-emitting element 20 is connected to power supply wiring, and another electrode of the capacitor 10k-1 is connected to one electrode (for example, a cathode) of the solid-state light-emitting element 20. Another electrode (for example, an anode) of the solid-state light-emitting element 20 is connected to GND wiring. One electrode (for example, a drain electrode) of the semiconductor switch 30a is connected to the power supply wiring, and another electrode (for example, a source electrode) of the semiconductor switch 30a is connected to the GND wiring.

A circuit for driving the semiconductor switch 30a is similar to that in FIG. 17. The semiconductor switch 30a is driven by electric power supplied from a capacitor 10k-2 through the semiconductor switch 305 inside the driving element 300 to the gate electrode of the semiconductor switch 30a. When the semiconductor switch 30a is driven and a conduction state is entered, the current loop a (solid-line arrows in FIG. 21) starting from an electrode on the positive side of the capacitor 10k-1, passing though the semiconductor switch 30a and the solid-state light-emitting element 20, and reaching the electrode on the positive side of the capacitor 10k-1 is formed, and the solid-state light-emitting element 20 emits light.

As described above, in the circuit configuration in FIG. 21, the capacitor 10k-1 and the capacitor 10k-2 do not share electrodes. Even with this configuration, the driving element 300 for the semiconductor switch 30a that drives the solid-state light-emitting element 20 is placed on the outer face of the capacitor for electric power supply to the solid-state light-emitting element 20, and the path length of the current loop b for gate driving can thus be shortened compared to the case where the driving element is provided outside. As a result, parasitic inductor can be reduced. Furthermore, the capacitor 10k-2 for supplying electric power to the driving element 300 is formed inside the capacitor on which the solid-state light-emitting element 20 and the like are placed, and thus, the path length of the current loop b can further be shortened.

Figure 22A:
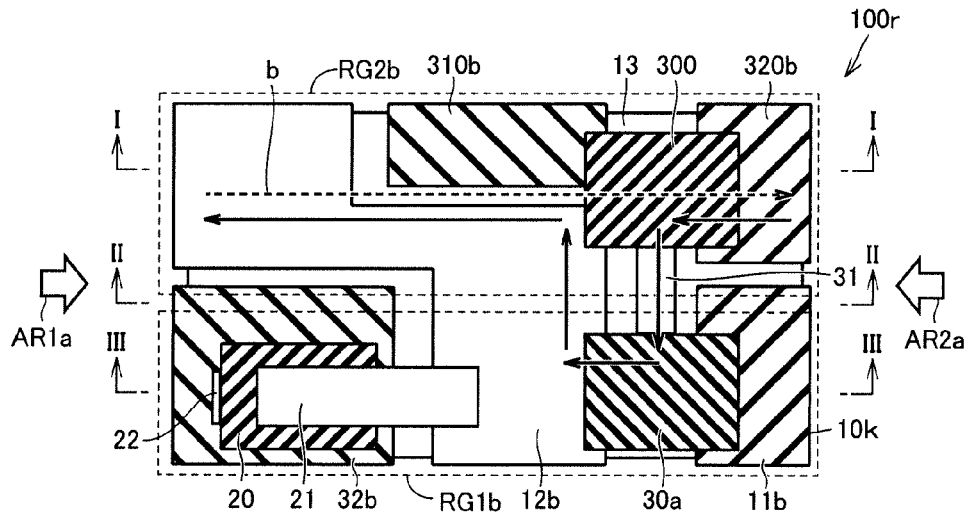
FIGS. 22A, 22B, 22C, and 22D include schematic diagrams for explaining a configuration of the light-emitting device according to the modification (11) of the present disclosure.
Figure 22B:
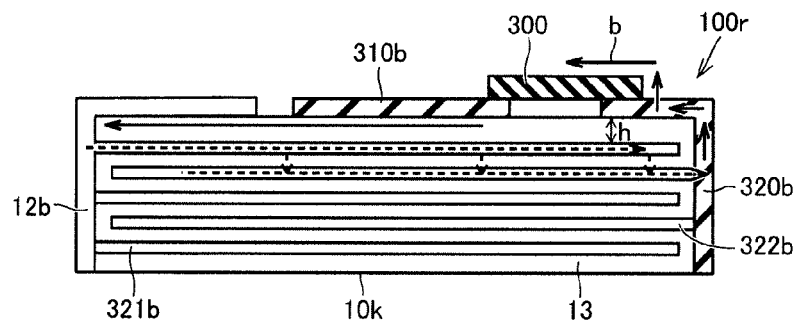
Figure 22C:
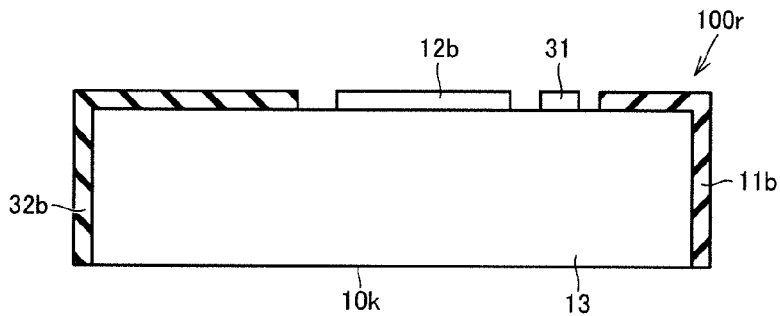
Figure 22D:
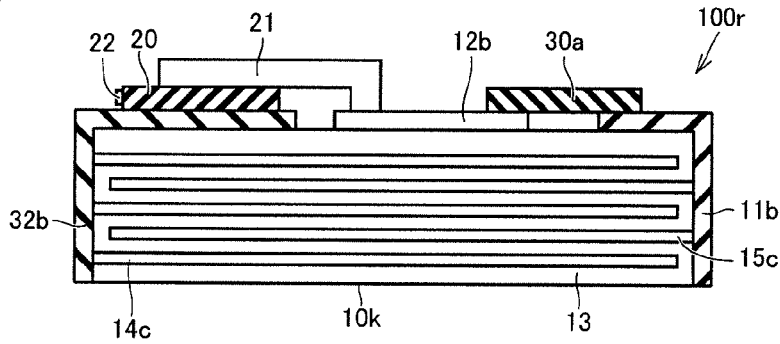
Figure 23A:
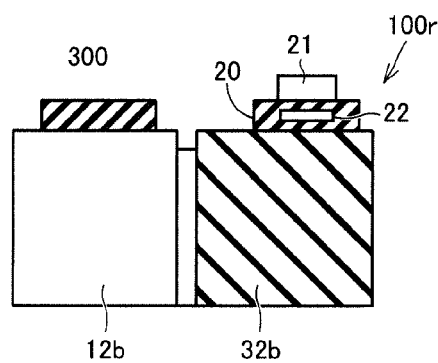
FIGS. 23A and 23B include side views of the light-emitting device according to the modification (11) of the present disclosure.
Figure 23B:
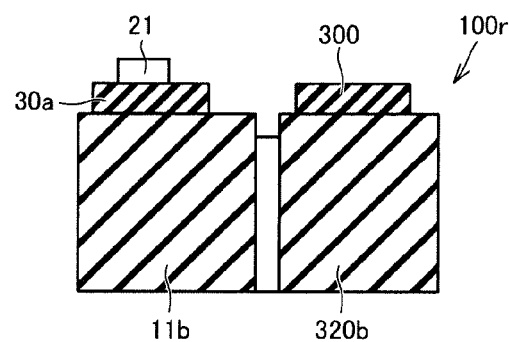

FIGS. 22A, 22B, 22C, and 22D include schematic diagrams for explaining the configuration of the light-emitting device 100r according to the modification (11) of the present disclosure. FIG. 22A is a plan view of the light-emitting device 100r when viewed from the outer face of a capacitor 10k on which the solid-state light-emitting element 20 is placed, FIG. 22B is a cross-section view of the light-emitting device 100r taken along plane I-I, FIG. 22C is a cross-section view of the light-emitting device 100r taken along plane II-II, and FIG. 20D is a cross-section view of the light-emitting device 100r taken along plane III-III. FIGS. 23A and 23B include side views of the light-emitting device 100r. FIG. 23A is a side view when viewed from a direction of an arrow AR1a in FIG. 22A, and FIG. 23B is a side view when viewed from a direction of an arrow AR2a in FIG. 22A. The same features of the configuration of the light-emitting device 100r illustrated in FIGS. 22 and 23 as those of the configurations of the light-emitting devices illustrated in FIGS. 1 and 18 will be referred to with the same signs as those of the configurations of the light-emitting devices illustrated in FIGS. 1 and 18, and detailed explanation for those same features will not be repeated.

The light-emitting device 100r illustrated in FIGS. 22 and 23 includes the capacitor 10k, and the solid-state light-emitting element 20, the semiconductor switch 30a, and the driving element 300 that are placed on the outer face of the capacitor 10k. Outer electrodes 11b, 12b, 32b, 310b, and 320b are formed on the outer face of the capacitor 10k.

The capacitor 10k is a capacitor for electric power supply and is a multilayer ceramic capacitor. In the light-emitting device 100r illustrated in FIGS. 22A, 22B, 22C, and 22D, the capacitor 10k-1 for supplying electric power to the solid-state light-emitting element 20 and the capacitor 10k-2 for supplying electric power to the driving element 300 are formed. The capacitor 10k-1 is formed in a region RG1b in FIG. 22A and is a multilayer body in which a plurality of inner electrodes 14c and 15c for acquiring electrostatic capacitance and the dielectric ceramic layer 13 are laminated in an alternate manner. The inner electrodes 14c (first inner electrodes) are extended to one end portion of the capacitor 10k and are connected to the outer electrode 32b (first outer electrode) formed in the one end portion. The inner electrodes 15c (second inner electrodes) are extended to the other end portion of the capacitor 10k and are connected to the outer electrode 11b (second outer electrode) connected to the power supply wiring (FIG. 22D).

In contrast, the capacitor 10k-2 is formed in a region RG2b in FIG. 22A and is a multilayer body in which a plurality of inner electrodes 321b and 322b for acquiring electrostatic capacitance and the dielectric ceramic layer 13 are laminated in an alternate manner. The inner electrodes 321b (third inner electrodes) are extended to an end portion on the outer electrode 32b side and are connected to the outer electrode 12b (third outer electrode) connected to the GND wiring. The inner electrodes 322b (fourth inner electrodes) are extended to an end portion on the outer electrode 11b side and are connected to the outer electrode 320b (fourth outer electrode) formed on the end portion (FIG. 22B). As illustrated in FIG. 22A, the outer electrode 12b (third outer electrode) extends from the vicinity of the center of the region RG1b to a left end part of the region RG2b.

As illustrated in FIG. 22C, in an area between the region RG1b in which the capacitor 10k-1 is formed and the region RG2b in which the capacitor 10k-2 is formed, there is a region in which no inner electrodes are arranged and only the dielectric ceramic layer 13 is arranged. That is, the inner electrodes 14c and 15c and the inner electrodes 321b and 322b are not directly connected and are not shared.

The solid-state light-emitting element 20 is placed on the outer electrode (connecting electrode) 32b of the capacitor 10k. Furthermore, the solid-state light-emitting element 20 is connected to the outer electrode 12b by the wiring 21. The semiconductor switch 30a is connected to the outer electrode 11b and the outer electrode 12b. Accordingly, the current loop a having a path extending from the outer electrode 11b (inner electrodes 15c) connected to the power supply wiring and passing through the semiconductor switch 30a, the outer electrode 12b, the wiring 21, the solid-state light-emitting element 20, the outer electrode 32b, and the inner electrodes 14c is formed. In the modification (11), the solid-state light-emitting element 20 and the semiconductor switch 30a are connected in series by the outer electrode 12b and the wiring 21, and the outer electrode 12b and the wiring 21 correspond to a conductive part.

The driving element 300 is electrically connected to the outer electrode 320b for electric power supply, the outer electrode 310b for a control signal, and the outer electrode 12b connected to the GND wiring on the outer face of the capacitor 10k. Furthermore, the driving element 300 is electrically connected to the semiconductor switch 30a with the gate extended electrode 31 interposed therebetween. As illustrated in FIGS. 22A and 22B, the current loop b passing through the driving element 300 has a path going through the inner electrodes 322b, the outer electrode 320b, the driving element 300, the gate extended electrode 31, the semiconductor switch 30a, the outer electrode 12b, and the inner electrodes 321b of the capacitor 10k-2. That is, the current loop is formed inside the substrate at which the light-emitting device 100r is formed, as in the modification (10). Thus, compared to the case where the driving element 300 is provided outside the substrate, the current loop b can be shortened. Also in the modification (11), regarding the direction of flow of the current loop b, the direction of current flowing from the outer electrode 320b, passing through the driving element 300, and reaching the outer electrode 12b and the direction of current flowing in the inner electrodes 321b and 322b are opposite to each other with the distance h of the exterior thickness of the capacitor 10k. Accordingly, the effect that magnetic fluxes generated by current cancel each other out (effect of offset) increases, and the parasitic inductance of the current loop b can thus be reduced.

As described above, also with the configuration of the light-emitting device 100r, not only the parasitic inductance of the current loop a for driving current for the solid-state light-emitting element 20 but also the parasitic inductance of the current loop b for current flowing in the driving element 300 is reduced. Thus, the pulse width of current can be reduced, and light with a short pulse can thus be output from the solid-state light-emitting element 20.

As described above, the light-emitting device 100r according to the modification (11) of the present disclosure includes the driving element 300 that is placed on the outer face of the capacitor 10k and provided for driving the semiconductor switch 30a (switching element). Furthermore, the capacitor 10k includes the inner electrodes 321b (third inner electrodes) and the inner electrodes 322b (fourth inner electrodes) that are provided to sandwich the dielectric ceramic layer 13 therebetween, the outer electrode 12b (third outer electrode) that is electrically connected to the inner electrodes 321b, and the outer electrode 320b (fourth outer electrode) that is electrically connected to the inner electrodes 322b. The inner electrodes 321b are insulated from the inner electrodes 14c (first inner electrodes). The driving element 300 is connected between the outer electrode 320b (fourth outer electrode) and the outer electrode 12b (third outer electrode). Thus, the parasitic inductance of the current loop b for current flowing in the driving element 300 can be reduced, and light with a short pulse can thus be output from the solid-state light-emitting element 20.

Figure 24A:
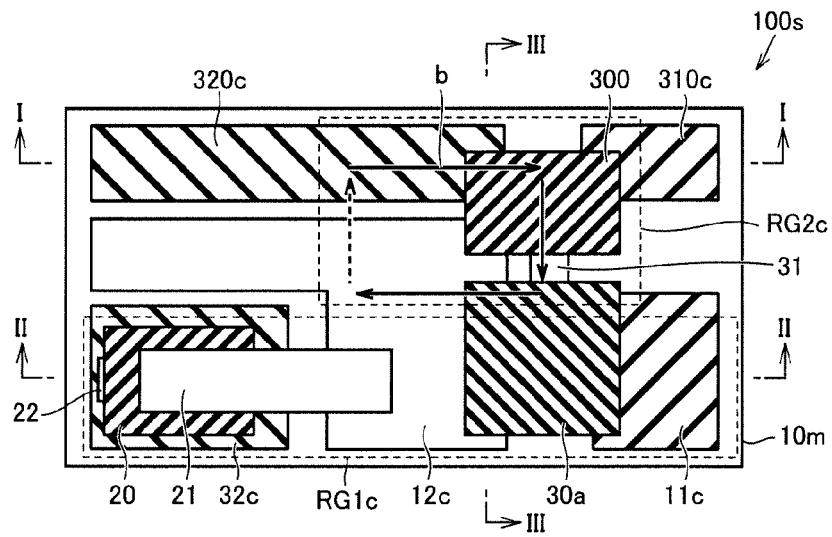
FIGS. 24A, 24B, 24C, and 24D include schematic diagrams for explaining another example of the configuration of the light-emitting device according to the modification (11) of the present disclosure.
Figure 24B:
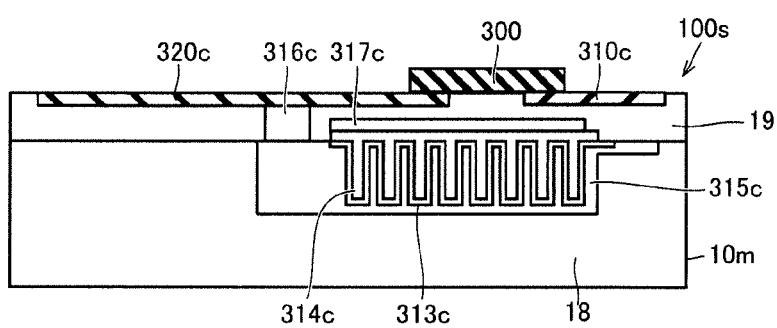
Figure 24C:
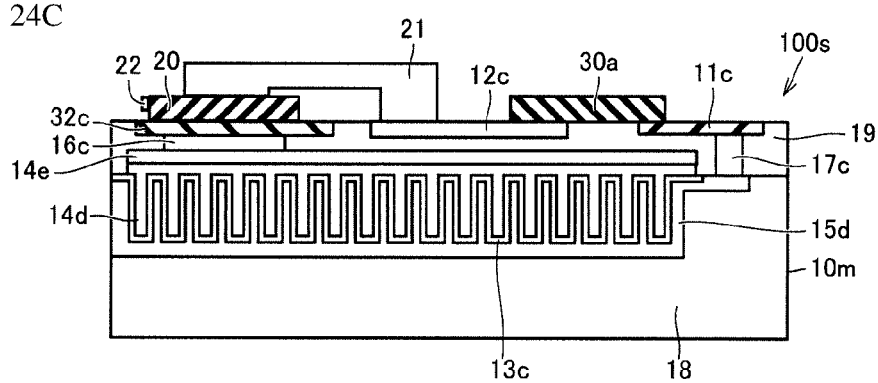
Figure 24D:
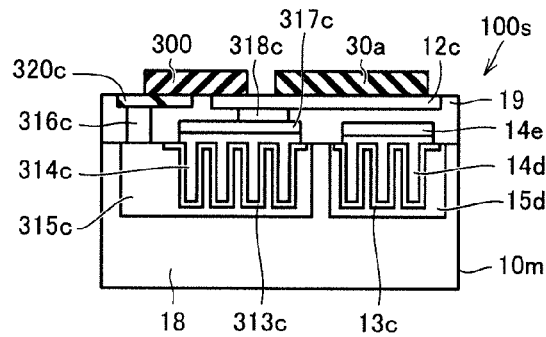

FIGS. 24A, 24B, 24C, and 24D include schematic diagrams for explaining another example of the configuration of the light-emitting device according to the modification (11) of the present disclosure and has a configuration in which a semiconductor capacitor is used as the capacitor, as in the modification (10) illustrated in FIGS. 20A, 20B, 20C, and 20D. FIG. 24A is a plan view of a light-emitting device 100s when viewed from the outer face of a capacitor 10m on which the solid-state light-emitting element 20 is placed, FIG. 24B is a cross-section view of the light-emitting device 100s taken along plane I-I, FIG. 24C is a cross-section view of the light-emitting device 100s taken along plane II-II, and FIG. 24D is a cross-section view of the light-emitting device 100s taken along plane III-III. The light-emitting device 100s illustrated in FIGS. 22A, 22B, 22C, and 22D include the capacitor 10m, and the solid-state light-emitting element 20, the semiconductor switch 30a, and the driving element 300 that are placed on the outer face of the capacitor 10m.

The capacitor 10m is a capacitor for electric power supply and is a semiconductor capacitor. In the light-emitting device 100s illustrated in FIGS. 24A, 24B, 24C, and 24D, a capacitor 10m-1 for supplying electric power to the solid-state light-emitting element 20 and a capacitor 10m-2 for supplying electric power to the driving element 300 are formed. The capacitor 10m-1 is formed in a region RG1c in FIG. 24A, and the capacitor 10m-2 is formed in a region RG2c in FIG. 24A.

As in FIGS. 20A, 20B, 20C, and 20D, the capacitor 10m-1 is formed by the semiconductor process. The capacitor 10m-1 includes the N+ layer 15d formed by injecting n-type impurity ion at high concentration into the silicon substrate 18, the dielectric layer 13c made of an inorganic material formed on the surface of the N+ layer 15d by, for example, the CVD method, and a conductive polysilicon layer 14d formed on the surface of the dielectric layer 13c by the CVD method (FIG. 24C).

A metal layer 14e is formed above the polysilicon layer 14d, so that the resistivity of one electrode formed of the polysilicon layer 14d can be reduced. If a required resistivity can be obtained only with the polysilicon layer 14d, the metal layer 14e is not necessarily formed. In the case where the metal layer 14e is formed above the polysilicon layer 14d, the polysilicon layer 14d is electrically connected to an outer electrode 32c with the via conductor 16c interposed therebetween. The N+ layer 15d is electrically connected to an outer electrode 11c that is connected to the power supply wiring with the via conductor 17c interposed therebetween.

In a similar manner, the capacitor 10m-2 is formed by the semiconductor process. The capacitor 10m-2 includes an N+ layer 315c formed by injecting n-type impurity ion into the silicon substrate 18, a dielectric layer 313c made of an inorganic material formed on the surface of the N+ layer 315c by the CVD method or the like, and a conductive polysilicon layer 314c formed on the surface of the dielectric layer 313 by the CVD method (FIG. 24B). The capacitor 10m-1 and the capacitor 10m-2 may be made of p-type impurity ion in place of n-type impurity ion.

The N+ layer 315c of the capacitor 10m-2 is a low-resistivity layer formed by injecting n-type impurity ion at high concentration into a surface of the silicon substrate 18 with a recessed and projected shape formed by forming a plurality of trenches or a plurality of pillars into the silicon substrate 18.

The polysilicon layer 314c is used as one electrode (third inner electrode) that forms the capacitance of the capacitor 10m-2. A metal layer 317c is formed above the polysilicon layer 314c, so that the resistivity of the one electrode formed of the polysilicon layer 314c can be reduced. If a required resistivity can be obtained only with the polysilicon layer 314c, the metal layer 317c is not necessarily formed. In the case where the metal layer 317c is formed above the polysilicon layer 314c, the polysilicon layer 314c is electrically connected to an outer electrode 12c connected to the GND wiring with a via conductor 318c interposed therebetween (FIG. 24D).

Furthermore, although the one electrode (third inner electrode) that forms the capacitance of the capacitor 10m-2 is formed of the polysilicon layer 314c, the electrode may be formed of a metal layer or the like. The N+ layer 315c may be used as another electrode (fourth inner electrode) that forms the capacitance of the capacitor 10m-2. The N+ layer 315c is electrically connected to an outer electrode 320c with a via conductor 316c interposed therebetween.

The solid-state light-emitting element 20 is placed on the outer electrode 32c. One electrode (for example, a cathode) of the solid-state light-emitting element 20 is connected to the outer electrode 32c, and another electrode (for example, an anode) of the solid-state light-emitting element 20 is connected to the outer electrode 12c by the wiring 21.

One electrode (for example, a drain electrode) of the semiconductor switch 30a is connected to the outer electrode 11c, and another electrode (for example, a source electrode) of the semiconductor switch 30a is connected to the outer electrode 12c.

The driving element 300 is electrically connected to the outer electrode 320c for electric power supply, an outer electrode 310c for a control signal, and the outer electrode 12c connected to the GND wiring on the outer face of the capacitor 10m. Furthermore, the driving element 300 is electrically connected to the semiconductor switch 30a with the gate extended electrode 31 interposed therebetween.

In the light-emitting device 100s illustrated in FIGS. 24A, 24B, 24C, and 24D, the current loop b going through the driving element 300 has a path passing through the N+ layer 315c, the via conductor 316c, the outer electrode 320c, the driving element 300, the gate extended electrode 31, the semiconductor switch 30a, the outer electrode 12c, the via conductor 318c, the metal layer 317c, and the polysilicon layer 314c of the capacitor 10m-2, as illustrated in FIGS. 24A, 24B, 24C, and 24D. In the light-emitting device 100s, the current loop b can be shortened. Thus, the parasitic inductance of the current loop b for current flowing in the driving element 300 is also reduced. Accordingly, the pulse width of current can be reduced, and light with a short pulse can thus be output from the solid-state light-emitting element 20.

It should be understood that the embodiments disclosed herein are illustrative and non-restrictive in every respect. The scope of the present disclosure is defined by the scope of the claims, rather than the description above, and is intended to include any modification within the scope and meaning equivalent to the scope of the claims.

REFERENCE SIGNS LIST 10 capacitor, 11, 12, 310, 312, and 320 outer electrode, 13 dielectric ceramic layer, 13a, 13c, and 313 dielectric layer, 14, 15, 321, and 322 inner electrode, 14a, 14c, and 314 polysilicon layer, 14b and 317 metal layer, 15a, 15c, and 315 N+ layer, 16, 17, 316, and 318 via conductor, 18 silicon substrate, 19 insulating film, 20 solid-state light-emitting element, 21, 33, and 41 wiring, light-emitting unit, 23 metal plate, 30, 30a, and 305 semiconductor switch, 31 gate extended electrode, 32 connecting electrode, 40 clamp diode, 50 light-receiving element, 60 passivation layer, 100 light-emitting device, 300 driving element

The invention claimed is:

1. A light-emitting device comprising:
   a capacitor comprising:
     a dielectric layer,
     a first inner electrode and a second inner electrode, the dielectric layer being between the first inner electrode and the second inner electrode,
     a first outer electrode electrically connected to the first inner electrode,
     a second outer electrode electrically connected to the second inner electrode, and
     a conductive portion between the first outer electrode and the second outer electrode;
   one or more solid-state light-emitting elements configured to emit light when electric power is supplied from the capacitor; and
   a switch configured to control the electric power supplied from the capacitor to the solid-state light-emitting element,
   wherein the solid-state light-emitting element is on an outer face of the capacitor, the switch is on the outer face of the capacitor or inside the capacitor, and the conductive portion connects the solid-state light-emitting element and the switch in series.

2. The light-emitting device according to claim 1, wherein the conductive portion comprises a connecting electrode on the outer face of the capacitor.

3. The light-emitting device according to claim 1, wherein the capacitor is a semiconductor capacitor having the dielectric layer, the first inner electrode, and the second inner electrode in a semiconductor substrate.

4. The light-emitting device according to claim 3, wherein the semiconductor capacitor comprises an insulating film of 10 μm or less on the outer face of the capacitor, and the semiconductor capacitor comprises a connecting electrode on the outer face of the capacitor with the insulating film interposed therebetween.

5. The light-emitting device according to claim 3, wherein in the semiconductor capacitor, the dielectric layer is in a vertical direction relative to the outer face of the capacitor on which the solid-state light-emitting element and the switch are located.

6. The light-emitting device according to claim 5, wherein the semiconductor capacitor further comprises a projected portion of the semiconductor substrate that is immediately below a position at which the solid-state light-emitting element and the switch are located, and that is located laterally to the dielectric layer, the first inner electrode, and the second inner electrode.

7. The light-emitting device according to claim 5, wherein the semiconductor capacitor further comprises:
   a first via conductor electrically connected to the first inner electrode and to the solid-state light-emitting element, and
   a second via conductor electrically connected to the second inner electrode and to the switch.

8. The light-emitting device according to claim 7, wherein the first via conductor and the second via conductor are electrically connected to a third via conductor, the third via conductor reaching a face of the semiconductor capacitor that is opposite to the outer face of the semiconductor capacitor.

9. The light-emitting device according to claim 8, wherein the third via conductor is of a material having a thermal conductivity that is greater than a thermal conductivity of a material of the semiconductor substrate.

10. The light-emitting device according to claim 3, wherein the semiconductor substrate is silicon.

11. The light-emitting device according to claim 1,
   wherein the capacitor further comprises:
     a first via conductor electrically connected to the first inner electrode and to the solid-state light-emitting element, and
     a second via conductor electrically connected to the second inner electrode and to the switch, and
   wherein the first via conductor and the second via conductor are electrically connected to an outer electrode of the capacitor.

12. The light-emitting device according to claim 11,
wherein the first via conductor is at a position connected to a first end of the solid-state light-emitting element on the outer face of the capacitor, and
wherein the second via conductor is at a position connected to a first end of the switch on the outer face of the capacitor.

13. The light-emitting device according to claim 1,
wherein the solid-state light-emitting element is configured to emit light in a direction parallel to the outer face of the capacitor, and
wherein the switch is on the outer face of the capacitor at a position that avoids an optical path of the light emitted from the solid-state light-emitting element.

14. The light-emitting device according to claim 13, wherein the switch is arranged so as to be shifted relative to the optical path in a direction parallel with the outer face.

15. The light-emitting device according to claim 13, wherein the switch is arranged so as to be shifted relative to the optical path in a direction orthogonal to the outer face.

16. The light-emitting device according to claim 13, further comprising a light-receiving element in the optical path, the light-receiving element being configured to receive the light emitted from the solid-state light-emitting element.

17. The light-emitting device according to claim 1, further comprising:
a driving circuit that is on the outer face of the capacitor and that is configured to drive the switch,
wherein the capacitor further comprises:
a third inner electrode and a fourth inner electrode, the dielectric layer being between the third inner electrode and the fourth inner electrode,
a third outer electrode electrically connected to the third inner electrode, and
a fourth outer electrode electrically connected to the fourth inner electrode,
wherein the third inner electrode is insulated from the first inner electrode, and
wherein the driving circuit is connected between the third outer electrode and the fourth outer electrode.

18. The light-emitting device according to claim 17, wherein the fourth outer electrode is electrically connected to the second outer electrode.

19. A capacitor comprising:
a dielectric layer;
a first inner electrode and a second inner electrode, the dielectric layer being between the first inner electrode and the second inner electrode;
a placement portion on which one or more solid-state light-emitting elements and a switch are located, the solid-state light-emitting elements being configured to emit light when electric power is supplied from the capacitor, and the switch being configured to control the electric power supplied from the capacitor to the solid-state light-emitting element; and
a conductive portion on the placement portion, the conductive portion being configured to connect the capacitor and the switch in series, the conductive portion connecting the solid-state light-emitting elements and the switch in series,
wherein the one or more solid-state light-emitting elements and the switch are on a same outer face of the capacitor.

* * * * *

UNITED STATES PATENT AND TRADEMARK OFFICE
CERTIFICATE OF CORRECTION

PATENT NO. : 11,652,092 B2
APPLICATION NO. : 17/071347
DATED : May 16, 2023
INVENTOR(S) : Naomi Takimoto et al.

Page 1 of 1

It is certified that error appears in the above-identified patent and that said Letters Patent is hereby corrected as shown below:

In the Specification

Column 35, Line 49, "wiring, light-emitting unit," should be -- wiring, 22 light-emitting unit, --.

Signed and Sealed this
Twentieth Day of February, 2024

Katherine Kelly Vidal
*Director of the United States Patent and Trademark Office*